(12) United States Patent
Mucke et al.

(10) Patent No.: US 6,211,745 B1
(45) Date of Patent: Apr. 3, 2001

(54) METHOD AND APPARATUS FOR DIGITALLY CONTROLLING THE CAPACITANCE OF AN INTEGRATED CIRCUIT DEVICE USING MOS-FIELD EFFECT TRANSISTORS

(75) Inventors: Lars Henrik Mucke; Christopher Dennis Hull, both of San Diego, CA (US); Lars Gustaf Jansson, Long Island, ME (US)

(73) Assignee: Silicon Wave, Inc., San Diego, CA (US)

( * ) Notice: Subject to any disclaimer, the term of this patent is extended or adjusted under 35 U.S.C. 154(b) by 0 days.

(21) Appl. No.: 09/304,443

(22) Filed: May 3, 1999

(51) Int. Cl.$^7$ ............ H01L 29/93; H01L 29/94; H03B 5/12

(52) U.S. Cl. ............... 331/117 R; 331/177 V; 331/179; 257/312; 257/595

(58) Field of Search ............ 331/117 R, 117 FE, 331/167, 177 V, 179; 257/312, 595, 598

(56) References Cited

U.S. PATENT DOCUMENTS

| | | | |
|---|---|---|---|
| 3,890,635 | * 6/1975 | Engeier | 357/14 |
| 3,909,748 | 9/1975 | Yuan, et al. | 331/117 |
| 5,297,056 | * 3/1994 | Lee et al. | 364/482 |
| 5,625,325 | * 4/1997 | Rotzoll et al. | 331/179 |
| 5,739,730 | * 4/1998 | Rotzoll | 331/179 |
| 5,745,012 | 4/1998 | Oka, et al. | 331/68 |
| 5,905,398 | * 5/1999 | Todsen et al. | 327/337 |
| 5,914,513 | * 6/1999 | Shenai et al. | 257/312 |

FOREIGN PATENT DOCUMENTS

WO96/26545  8/1996 (WO) .............. H01L/27/12

\* cited by examiner

*Primary Examiner*—Siegfried H. Grimm
(74) *Attorney, Agent, or Firm*—Martin J. Jaquez, Esq.; Jaquez & Associates

(57) ABSTRACT

A method and apparatus for digitally controlling the capacitance of an integrated circuit device using MOS-FET devices. In accordance with one aspect of the present invention, a one-bit or "binary" varactor is presented wherein the gate-to-bulk capacitance of the MOS-FET device exhibits dependency to a D.C. voltage applied between its gate and well implant regions. The capacitance-voltage characteristic of the binary capacitor has three major regions: (1) a first relatively flat region having little or no voltage dependency and having a capacitance equal to a first low capacitance of $C_1$; (2) a sloped region wherein a voltage dependency exists; and (3) a second relatively flat region where there is little or no voltage dependency and where the capacitance equals a second higher capacitance of $C_2$. The capacitance of the binary capacitor can be changed from $C_1$ to $C_2$ simply by changing the polarity of the applied D.C. voltage from a positive to a negative value. A plurality of binary capacitors are configured in a parallel arrangement to produce a digitally controlled capacitor. The digitally controlled capacitor can be used in any integrated circuit requiring a tightly controlled tuned network. One application is a voltage-controlled oscillator (VCO) wherein the center output frequency of the VCO is calibrated by digitally modifying the capacitance of the VCO's digitally controlled capacitor. A means for determining whether the VCO requires calibration and a means for calibrating the center output frequency of the VCO is presented.

28 Claims, 13 Drawing Sheets

METHOD AND APPARATUS FOR DIGITALLY CONTROLLING THE CAPACITANCE OF AN INTEGRATED CIRCUIT DEVICE USING MOS-FIELD EFFECT TRANSISTORS

BACKGROUND OF THE INVENTION

1. Field of the Invention

This invention relates to integrated circuit devices, and more particularly to a method and apparatus for digitally controlling the capacitance of integrated circuit components using MOS field effect transistors.

2. Description of Related Art

One well-known problem to those skilled in the art of the design and manufacture of integrated circuits is the poor tolerance values associated with integrated circuit components, especially the tolerance values of passive circuit components. Due to process variations, device parameter spread, variations in critical parameters such as conductive layer sheet resistance values, film thickness, process uniformity and manufacturing equipment cleanliness, and other factors, integrated circuit passive electrical components often have tolerances that are approximately an order of magnitude worse than their analogous discrete external passive electrical components. Consequently, it has proven difficult and costly in the past to implement tuned networks or circuits using on-chip passive electrical components. One such tuned circuit is a voltage-controlled oscillator (VCO) in which a number of passive electrical devices are typically utilized to establish both the operating frequency and frequency offset of the VCO.

One well-known solution to this tolerance problem is to "trim" the integrated circuit until it operates within a set of pre-defined post-fabrication parameters. These "post-fabrication trimming" techniques are performed after manufacturing and testing the integrated circuit and are designed to physically alter the integrated circuit using a variety of methods including "Zener-zapping", laser trimming and fuse trimming. For example, using well-known fuse trimming techniques, fuseable links in an integrated circuit can be blown until the integrated circuit performs adequately under selected nominal conditions. Using these post-fabrication trimming techniques, passive electrical devices can be "fine-tuned" until they have acceptable tolerance values under nominal conditions. Disadvantageously, the trimming techniques produce only static solutions. For example, in fuse trimming, although the devices may perform adequately under nominal conditions, they may not perform adequately under all of the operating conditions of the integrated circuit. However, disadvantageously, the integrated circuit is permanently configured once the fuses are blown.

For example, as the voltage and temperature of the integrated circuit varies over time, offsets can be introduced despite the static settings created during the fuse trimming process. Devices that were once usable under the nominal conditions at which the fuses were blown may become unusable under some operating conditions, thus adversely affecting yield characteristics of the integrated circuits. In addition, the prior art post-fabrication solutions disadvantageously introduce additional manufacturing and testing steps into the manufacturing process. Using these prior art approaches, the manufacturer must first measure performance characteristics, trim the integrated circuits to conform to a selected set of performance and tolerance criteria, and test the results to ensure that the integrated circuit is trimmed appropriately. Thus, the prior art post-fabrication trimming techniques add additional time to the design and fabrication of integrated circuit devices and consequently add to the manufacturing costs of the integrated circuits.

Therefore, an improved method for improving the tolerances of passive electrical devices in an integrated circuit is needed which does not require the use of post-fabrication trimming techniques. Further, an improved method and apparatus is needed which dynamically monitors and corrects the performance characteristics of integrated circuits under all operating conditions. The improved method and apparatus should monitor and correct the performance characteristics of tuned networks especially as these performance characteristics are adversely affected by poor tolerances of on-chip passive electrical devices.

FIG. 1 shows a prior art attempt at solving the problem of implementing tuned circuits using on-chip passive electrical devices having poor or unacceptable tolerance values. As shown in FIG. 1, using an integrated switchable capacitor circuit 100, two terminals of an integrated tuned circuit (i.e., terminal A 101 and terminal B 103) can be selectively coupled to a bank of switchably connected capacitors ($C_1$ through $C_n$). Each of the capacitors is selectively coupled between the terminals 101, 103 by closing an associated and respective coupling switch $S_n$. For example, capacitor $C_1$ 102 is coupled between the terminals 101, 103 by closing an associated switch $S_1$ 110. Similarly, capacitor $C_2$ 104 is coupled between the terminals 101, 103 by closing an associated switch $S_2$ 112. Finally, capacitor $C_n$ 108 is coupled between the terminals 101, 103 by closing an associated switch $S_n$ 116. Because the individual capacitors are connected in a parallel configuration, the total capacitance between the terminals 101, 103 is equal to the sum of the individual capacitors that are switched into the circuit (assuming that the switches do not also introduce capacitance to the circuit). By electrically connecting the terminals 101, 103 to a tuned circuit that is on the same integrated circuit as the switchable capacitor circuit 100, the capacitors can be selectively switched in and out of the tuned circuit, thereby changing the capacitance between the terminals 101, 103 to a desired value. Thus, despite the poor tolerance characteristics of the capacitors $C_1$ through $C_n$, the tuned circuit can be adjusted to operate within desired parameters by simply changing the capacitance between terminals A 101 and B 103.

Disadvantageously, this prior art approach is undesirable when the tuned circuit operates at relatively high frequencies. For example, when the tuned circuit operates in the GHz range of operating frequencies, the bank of switches (e.g., 110, 112, 114, and 116) introduce significant loss into the tuned circuit and thereby degrade the circuit's performance characteristics. The prior art solution shown in FIG. 1 also disadvantageously increases both the amount of space (i.e., integrated circuit real estate) and the amount of power required to accommodate and operate the switches. Power requirements are increased due to the D.C. current required to operate the bank of switches.

Therefore, a need exists for a method and apparatus that can over come the disadvantages associated with the prior art solutions and that will facilitate the integration of tuned capacitor networks on a single integrated circuit. The need exists for an apparatus that facilitates the full integration of a calibrated tuned capacitor network such as a voltage-controlled oscillator (VCO). In addition, the need exists for an apparatus and method that can dynamically calibrate an integrated tuned capacitor network such as a VCO. The present invention provides such a method and apparatus.

The present method and apparatus uses a one-bit or "binary" capacitor formed from a MOSFET transistor that can be switched from a first pre-determined capacitance value to a second pre-determined capacitance value by varying an applied control voltage between first and second predetermined voltage values. A multi-bit digital capacitor can be implemented by connecting a bank of the binary capacitors in parallel, and by weighting the individual capacitors as desired. The multi-bit digital capacitor allows capacitance values to be customized to any desired and convenient value.

SUMMARY OF THE INVENTION

The present invention is a novel apparatus comprising a one-bit or "binary" capacitor formed from a MOSFET integrated device that can be switched from a first pre-determined capacitance value $C_1$ to a second pre-determined capacitance value $C_2$ by varying an applied control voltage between a first and a second pre-determined voltage value. An inventive multi-bit digital capacitor is implemented by connecting a bank of the binary capacitors in parallel, and by weighting the individual capacitors in a desired fashion. The multi-bit digital capacitor allows capacitance values within an integrated circuit device to be customized to any desired and convenient value.

The gate-to-bulk capacitance of the binary capacitor is dependent upon the D.C. voltage applied between the gate of the device and electrically coupled well contact implant regions. The capacitance-voltage characteristic of the binary capacitor has three major regions: (1) a first relatively flat region where there is little or no voltage dependency and where the capacitance equals a first low capacitance of $C_1$; (2) a sloped region wherein a voltage dependency exists; and (3) a second relatively flat region where there is little or no voltage dependency and where the capacitance equals a second higher capacitance of $C_2$. Simply changing the polarity of the applied D.C. voltage from a first value to a second value abruptly changes the capacitance of the binary capacitor from C1 to C2.

In accordance with one aspect of the present invention, a plurality of binary capacitors is arranged in a parallel configuration to produce a digitally controlled capacitor. Advantageously, the digitally controlled capacitor can be used in any integrated circuit that requires a tightly controlled tuned network. One such application is a voltage-controlled oscillator (VCO). In accordance with one aspect of the present invention, the inventive digitally controlled capacitor is used in implementing a LC-resonator circuit, which is part of a fully integrated VCO device. The LC resonance frequency of the LC-resonator is varied by digitally modifying the capacitance of the LC tank circuit. The LC tank circuit is tuned with respect to an applied D.C. control voltage. Process variations introduced during the integrated circuit manufacturing process require that the LC-resonance frequency be re-centered after fabrication. In accordance with the present invention, the center output frequency of the VCO is calibrated by digitally modifying the capacitance of the VCO's digitally controlled capacitor. A means for determining whether the VCO requires calibration and a means for calibrating the center output frequency of the VCO is also presented.

Consequently, the inventive VCO can be implemented in an integrated circuit design despite poor tolerance values typically associated with process variations in integrated circuit fabrication. The present invention advantageously increases the effectiveness of integrated circuit VCO designs, tuning networks, and the like. The present invention improves the performance of wireless communication devices without requiring the use of expensive and large discrete components. The present invention is particularly useful in broadband wireless digital communication systems such as CDMA cellular systems, however it can also find utility in other communication systems such as those made in accordance with the proposed Bluetooth standard.

The details of the preferred and alternative embodiments of the present invention are set forth in the accompanying drawings and the description below. Once the details of the invention are known, numerous additional innovations and changes will become obvious to one skilled in the art.

BRIEF DESCRIPTION OF THE DRAWINGS

FIG. 4b is a simplified schematic representation of the digital capacitor of FIG. 4a.

FIG. 5 is a plot showing how the capacitance of the multi-bit digital capacitor of FIG. 4a varies depending upon the digital control word $CAL_{word}$ applied to the terminals of the plurality of binary capacitors shown in FIG. 4a.

FIG. 6 shows a differential mode implementation of the digital capacitor of FIG. 4a.

Like reference numbers and designations in the various drawings indicate like elements.

DETAILED DESCRIPTION OF THE INVENTION

Throughout this description, the preferred embodiment and examples shown should be considered as exemplar, rather than as limitations on the present invention.

Figure 2:
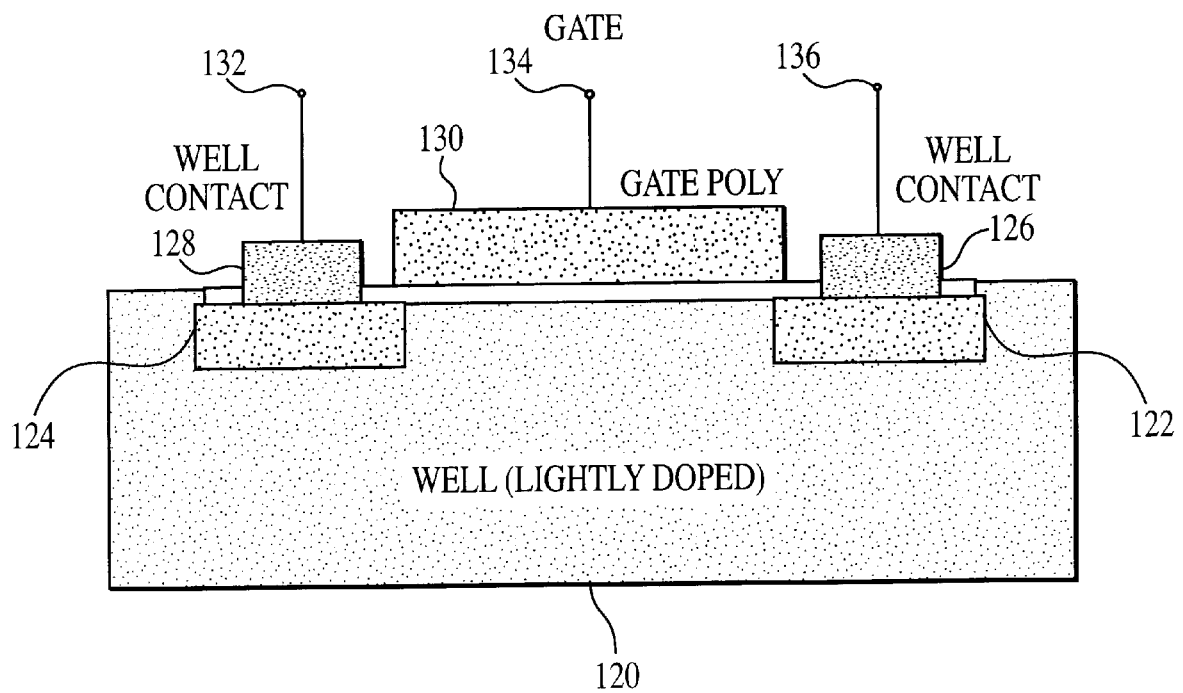
FIG. 2 shows a simplified cross-sectional view of a MOSFET structure configured for use as a "binary" capacitor in accordance with the present invention.

FIG. 2 shows a simplified cross-sectional view of a MOSFET structure configured for use as a "binary" capacitor in accordance with the present invention. As shown in FIG. 2, a binary capacitor 200 made in accordance with the present invention preferably comprises an N-well (or "bulk") 120, N+ well contact implant regions 122, 124, metal well contacts 126, 128, and a poly-silicon P-gate 130. Using well-known MOSFET fabrication techniques, the binary capacitor 200 of the present invention is preferably formed by lightly doping the N-well implant layer 120 (for a p-channel MOSFET device) with appropriate n-type dopant materials. The N+ well contact implant regions 122, 124 preferably comprise highly doped N+ regions diffused into the N-well implant layer 120. The metal area of the P-gate 130, in conjunction with the insulating dielectric oxide layer and the semiconductor channel formed between the N+ well contact implant regions 122, 124, create a parallel-plate capacitor. The capacitor is formed between the P-gate 134 and the electrically coupled metal well contacts 126 and 128. As described below in more detail with reference to FIG. 3, the capacitance between the P-gate 130 and the well 120 (the "gate-to-bulk" capacitance $C_{gate-bulk}$) of the binary capacitor 200 varies depending upon the D.C. bias voltage applied between the P-gate terminal 134 and the well contact implant terminals 132, 136.

Figure 3:
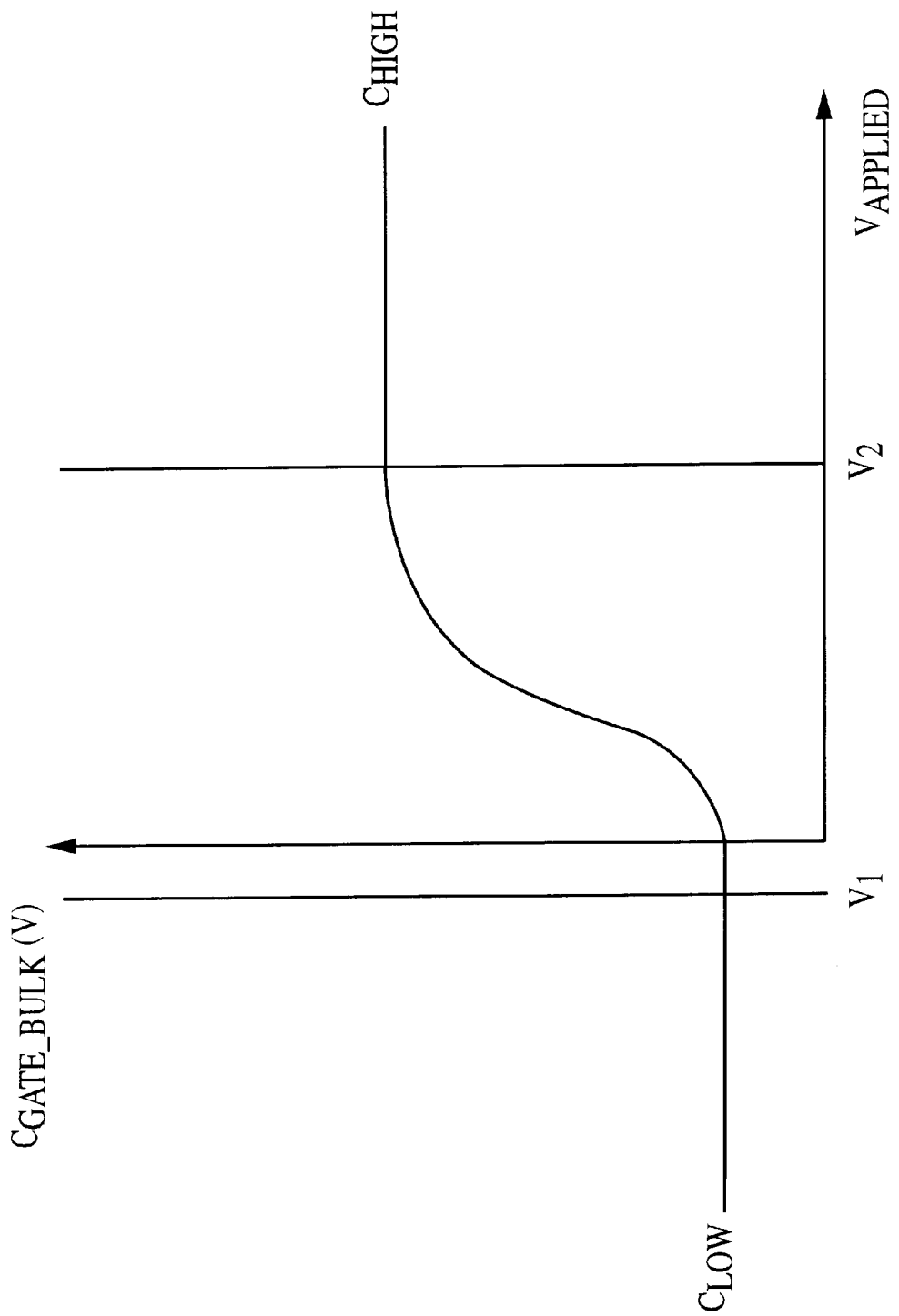
FIG. 3 is a capacitance-voltage (CV) plot showing the dependency of the gate-to-bulk capacitance $C_{gate-bulk}$ versus the D.C. bias voltage applied between the gate and the well of the binary capacitor shown in FIG. 2.

FIG. 3 shows the dependency of the gate-to-bulk capacitance $C_{gate-bulk}$ upon the D.C. bias voltage that is applied between the P-gate terminal 134 and the well contact implant terminals 132, 136 of the binary capacitor 200 of FIG. 2. As shown in the capacitance-voltage plot of FIG. 3, the gate-to-bulk capacitance $C_{gate-bulk}$ varies between a first capacitance value $C_{LOW}$ and a second capacitance value $C_{HIGH}$ as the applied D.C. bias voltage is varied between a first threshold voltage $V_1$ and a second voltage threshold $V_2$. In this embodiment of the binary capacitor 200 (i.e., a P-gate/N-well embodiment), $V_1$ and $V_2$ are applied to the P-gate terminal 134 with positive polarities with respect to the well contact terminals 132, 136. That is, $V_1$ and $V_2$ are applied as positive polarity voltages with respect to the N+ well contact implant regions 122, 124. The binary capacitor 200 is said to be operating in an "accumulation" mode in this embodiment.

Referring again to FIG. 3, by applying a D.C. bias voltage $V_{applied}$ that is equal to or less than $V_1$, $C_{gate-bulk}(V)=C_{LOW}$. By applying a positive D.C. bias voltage $V_{applied}$ that is equal to or greater than $V_2$, $C_{gate-bulk}(V)=C_{HIGH}$. As the D.C. bias voltage varies between the threshold voltages $V_1$ and $V_2$, $C_{gate-bulk}(V)$ follows the slope as shown in FIG. 3 and varies between the first capacitance value $C_{LOW}$ and the second capacitance value $C_{HIGH}$ (i.e., the binary capacitor 200 behaves as a varactor in this relatively narrow voltage range). Thus, as shown, the binary capacitor 200 of FIG. 2 has a first lower capacitance $C_{LOW}$ (that is flat over a relatively wide voltage range less than or equal to $V_1$), a second higher capacitance $C_{HIGH}$ (that is flat over a relatively wide voltage range greater than or equal to $V_2$), and a variable capacitance (variable between $C_{LOW}$ and $C_{HIGH}$) in the relatively narrow range of voltages between $V_1$ and $V_2$.

In one preferred embodiment of the binary capacitor, the second capacitance value $C_{HIGH}$ is approximately two to three times greater than the first capacitance value $C_{LOW}$. That is, $C_{HIGH}/C_{LOW}$ is approximately equal to 2 or 3 in one preferred embodiment. Simply varying the device geometry and thereby making the physical size of the capacitor larger or smaller can vary the specific values of $C_{LOW}$ and $C_{HIGH}$ for any specific binary capacitor.

By varying the D.C. bias voltage applied across the terminals (e.g., the terminals 132, 134, 136) of the binary capacitor 200 of FIG. 2, the capacitance value is varied between $C_{LOW}$ and $C_{HIGH}$. If $V_1$ represents a Boolean logic value of "zero", and $V_2$ represents a logical "one", then the capacitance $C_{gate-bulk}(V)$ can be digitally controlled using one control bit to be equal to either $C_{LOW}$ (when a logical zero is applied) or $C_{HIGH}$ (when a logical one is applied). Thus, the device shown in FIG. 2 is referred to as a "binary" capacitor because the capacitance of the device 200 can be digitally controlled to be equal to one of two states. Specifically, the digital control signal controls the difference or differential between $C_{HIGH}$ and $C_{LOW}$ (referred to hereinafter as the "differential capacitance"). That is $C_{LSB}$ (the differential capacitance of the binary capacitor 200 as controlled by a least significant bit of a digital control word) is equal to $C_{HIGH}$ minus $C_{LOW}$.

Although one embodiment of the binary capacitor of the binary capacitor is shown in FIG. 2, other alternative embodiments are possible. As described above, the binary capacitor 200 may be implemented using a bulk CMOS process. Alternatively, the binary capacitor may be implemented as an integrated circuit varactor structure that includes a P-gate/N-well layer structure preferably formed on a Silicon-on-Insulator ("SOI") substrate. In this embodiment of the binary capacitor 200, the varactor structure is completely isolated from the substrate of the integrated circuit by an oxide layer of the SOI substrate, and by oxide-filled trenches formed on both sides of the varactor structure. The trenches preferably extend to the oxide layer of the SOI substrate. This alternative embodiment of the binary capacitor 200 is described more fully in a co-pending, commonly assigned patent application, filed May 3, 1999, Ser. No. 09/304,457, entitled "Integrated Circuit Varactor having a Wide Capacitance Range." This application is incorporated by reference herein for its teachings of P-gate/N-well varactor structures.

In another preferred embodiment, the binary capacitor 200 may be implemented as an integrated circuit varactor structure that includes an N-gate/P-well structure formed on either an N-substrate bulk CMOS substrate or an SOI CMOS substrate. The N-gate/P-well embodiment of the binary capacitor is identical to the P-gate/N-well structure of FIG. 2, with the exception that the N-gate/P-well structure uses p-type dopant materials in the place of the n-type dopant materials used in the N-well device. More specifically, and referring again to FIG. 2, in a P-well implementation of the binary capacitor 200, the well implant layer 120 is preferably lightly doped with appropriate p-type dopant materials. Similarly, the contact implant regions 122, 124 preferably comprise highly-doped P+ regions diffused into the P-well implant layer 120 in the preferred P-well implementation of the binary capacitor 200 of FIG. 2.

The capacitance of the P-well binary capacitor 200 is controlled by applying a D.C. bias voltage between the N-gate terminal 134 and the electrically coupled well contact terminals 132, 136 as described above with reference to the N-well device. However, in the P-well embodiment of the binary capacitor, $V_1$ and $V_2$ are applied to the N-gate terminal 134 as negative polarity voltages with respect to the P-well contact terminals 132, 136. That is, $V_1$ and $V_2$ are applied as negative voltages with respect to the P+ well contact implant regions 122 and 124. In this embodiment the binary capacitor is said to be operating in a "depletion" mode.

As described above with reference to the N-well embodiment, by applying a negative polarity D.C. bias voltage $V_{applied}$ that is equal to or less than $V_1$ (i.e., in this embodiment, equal to or more positive than $V_1$), $C_{gate-bulk}$ (V)=$C_{LOW}$. By applying a negative D.C. bias voltage $V_{applied}$ that is equal to or greater than $V_2$ (i.e., in this embodiment, equal to or more negative than $V_2$), $C_{gate-bulk}$ (V)=$C_{HIGH}$. As the D.C. bias voltage varies between the threshold voltages $V_1$ and $V_2$, $C_{gate-bulk}$ (V) varies between the first capacitance value $C_{LOW}$ and the second capacitance value $C_{HIGH}$ (i.e., the binary capacitor 200 behaves as a varactor in this relatively narrow voltage range). Note that in this embodiment, the applied voltage $V_{applied}$ is increased to become more and more negative (e.g., from −0.5V to −1.5V) as it changes from the "low" threshold voltage of $V_1$ to the "high" threshold voltage $V_2$.

The N-gate/P-well integrated circuit varactor structure formed on an SOI substrate is described more fully in the incorporated co-pending, commonly assigned patent application entitled "Integrated Circuit Varactor having a Wide Capacitance Range." This patent application is incorporated by reference herein for its teachings of N-gate/P-well varactor structures.

As described in more detail below with reference to FIGS. 4–10, the present binary capacitor 200 of FIG. 2 can be used as an integral building block in any integrated circuit that requires the use of passive components having improved tolerances. For example, the binary capacitor 200 can be used to improve the performance of integrated circuit implementations of tuned capacitor networks such as voltage-controlled oscillators (VCO). Further, the binary capacitor 200 of the present invention can be used to implement a means of calibrating (both manually and automatically) a tuned capacitor network such as a VCO. Although the present binary capacitor 200 is described below with reference to its use in an integrated circuit implementation of a VCO, this specific use is exemplary only and should not be interpreted as limiting the scope or application of the present invention. Those skilled in the integrated circuit design and fabrication art will recognize that the binary capacitor 200 can be used to improve the performance of any integrated circuit requiring the use of passive electrical components.

Figure 4A:
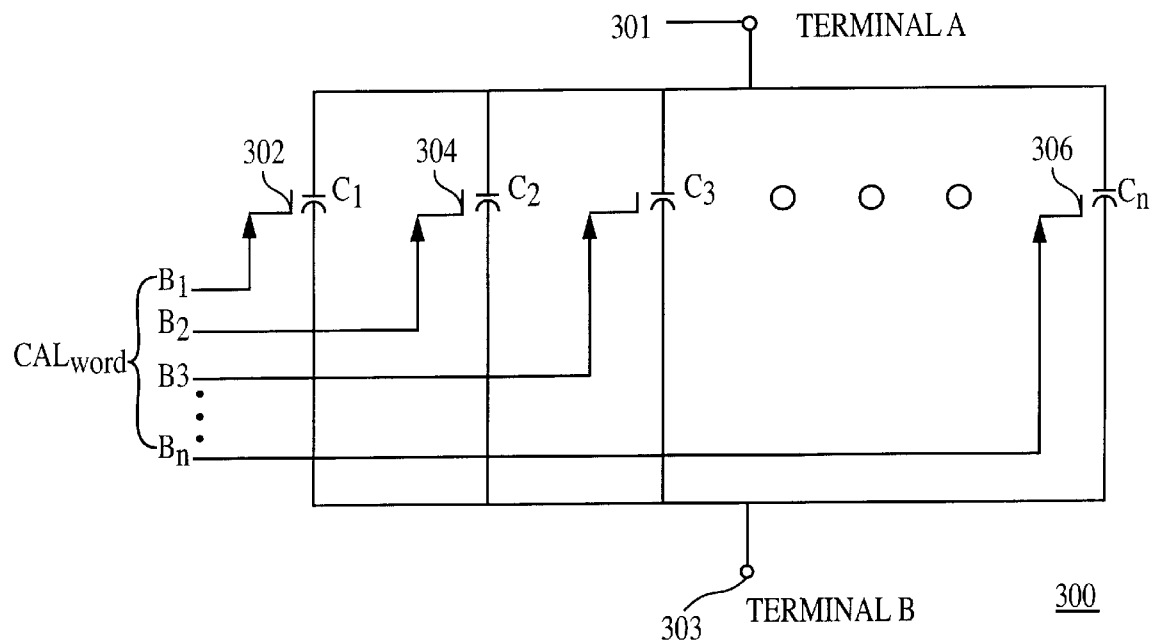
FIG. 4a is a simplified schematic showing the binary capacitor of FIG. 2 configured for use as a digitally controlled multi-bit digital capacitor having a digitally selectable and variable capacitance.

FIG. 4a shows how the binary capacitor 200 described above with reference to FIGS. 2 and 3 is used to create a digitally controlled or multi-bit digital capacitor 300 having a digitally selectable and variable capacitance. As shown in FIG. 4a, a plurality of binary capacitors are preferably connected in parallel between two terminals (i.e., between terminal A 301 and terminal B 303) within an integrated circuit (not shown). The terminals A 301 and B 303 are analogous to the terminals A 101 and B 103 of FIG. 1 and, as described in more detail below, may be connected to a tuned circuit such as a VCO. In accordance with the present invention, the capacitance values of the binary capacitors are preferably weighted in a convenient and desirable manner. For example, in the embodiment shown in FIG. 4a, the binary capacitors of the multi-bit digital capacitor 106 are given binary weighting. More specifically, the least-significant binary capacitor $C_1$ 302 is manufactured to have a desired least significant (or lowest) differential capacitance of $C_{LSB}$ (defined as the difference between $C_1$'s highest capacitance $C_{1\ HIGH}$ and $C_1$'s lowest capacitance $C_{1\ LOW}$).

The next significant binary capacitor $C_2$ 304 is preferably manufactured to have a differential capacitance of twice $C_{LSB}$, or $2*C_{LSB}$. The binary weighting is assigned in like fashion with each next significant capacitor having a differential capacitance that is a power of two greater than the previous significant capacitor. Finally, the most significant binary capacitor $C_n$ 306 is manufactured to have a differential capacitance of $2^{n-1}*C_{LSB}$. Those skilled in the IC manufacturing art will appreciate that several alternative means may be used to make the differential capacitance of a selected binary capacitor (for example, $C_2$) have a value that is a power of two greater than the previous significant capacitor (in this example, $C_1$). For example, in one embodiment, the selected capacitor (e.g., $C_2$) can be formed by placing two previous significant capacitors (in this example, $C_1$) in parallel. Similarly, the next significant capacitor (e.g., C3) can be formed by placing four of the previous significant capacitors (e.g., $C_1$) in parallel. Alternatively, the capacitors may be manufactured to different physical dimensions to have the desired differential capacitance characteristics.

In addition, although the binary capacitors of the embodiment shown in FIG. 4a are given a binary weighting, those skilled in the art will recognize that any convenient capacitance-weighting scheme can be assigned to the capacitors. For example, in an alternative embodiment where a logarithmic scaling is desired, each binary capacitor can be manufactured to have a capacitance value that is ten times greater than its previous significant capacitor. More specifically, binary capacitor $C_2$ 304 can be manufactured to have a differential capacitance that is $10*C_{LSB}$, where $C_1$ 302 is manufactured to have a differential capacitance of $C_{LSB}$. In this embodiment, $C_n$ is assigned a differential capacitance of $10^{n-1}*C_{LSB}$.

Referring again to FIG. 4a, the differential capacitance of each binary capacitor of the digital capacitor 106 is individually controlled by an associated and respective digital control signal that is applied over the terminals of the associated binary capacitor (i.e., by an associated and respective digital bit of a digital control word applied between the respective gate and well contact terminals). The control bits are ordered from least significant bit (LSB) to most significant bit (MSB), and are assigned to control the least significant capacitor to the most significant capacitor. Accordingly, the binary capacitors are ordered from least significant to most significant. For example, as shown in FIG. 4a, the least significant bit LSB, $B_1$ of the digital control word is preferably applied over the terminals of the least significant binary capacitor $C_1$ 302 and thereby controls the capacitance of the binary capacitor $C_1$ 302. The next most significant bit, $B_2$, is applied to the terminals of the binary capacitor $C_2$ and thereby controls its capacitance. The most significant bit, $B_n$, similarly controls the capacitance of binary capacitor $C_n$.

As described above with reference to FIGS. 2 and 3, when $B_1$, for example, is a logical low value, or D.C. for example, the capacitance of binary capacitor $C_1$ 302 is equal to a first lower capacitance $C_{1\ LOW}$. Alternatively, when $B_1$ is a logical high value, or $V_{cc}$ for example, the capacitance of the binary capacitor $C_1$ 302 is equal to a second higher capacitance $C_{1\ HIGH}$. The differential between $C_{1\ HIGH}$ and $C_{1\ LOW}$ is equal to $C_{LSB}$. Similarly, when $B_2$, for example, is a logical low value, or D.C., the capacitance of $C_2$ is equal to $C_{2\ LOW}$. When $B_2$ is a logical high value, or $V_{cc}$, the capacitance of binary capacitor $C_2$ is equal to $C_{2\ HIGH}$. Due to the binary weighting of C2, the differential capacitance of C2 (i.e., the difference between $C_{2\ HIGH}$ and $C_{2\ LOW}$) is equal to $2*C_{LSB}$. The trend continues as such, with each next significant binary capacitor having a differential capacitance that is twice the differential capacitance of its previous significant capacitor. Finally, as shown in FIG. 4a, the capacitance of binary capacitor $C_n$ 306 varies between $C_{n\ LOW}$ and $C_{n\ HIGH}$, as $B_n$ varies between a logic low and logic high value. Again, due to the binary weighting of the capacitors the differential capacitance between $C_{n\ HIGH}$ and $C_{n\ LOW}$ is approximately equal to $2^{n-1}*C_{LSB}$.

Figure 4B:
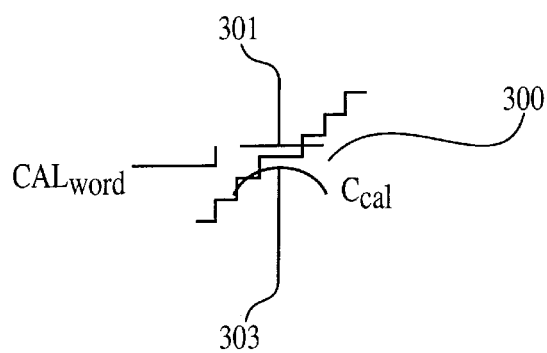

Because the plurality of binary capacitors are connected together in a parallel configuration as shown in FIG. 4a, their respective capacitance values combine by simply adding the capacitance values of all of the individual binary capacitors. The capacitance of the digital capacitor 106 (as measured between the terminals A 301 and B 303) is therefore equal to the sum of the capacitance of each of the binary capacitors $C_n$. FIG. 4b is a simplified schematic representation of the digital capacitor 106 shown in FIG. 4a.

Figure 5:
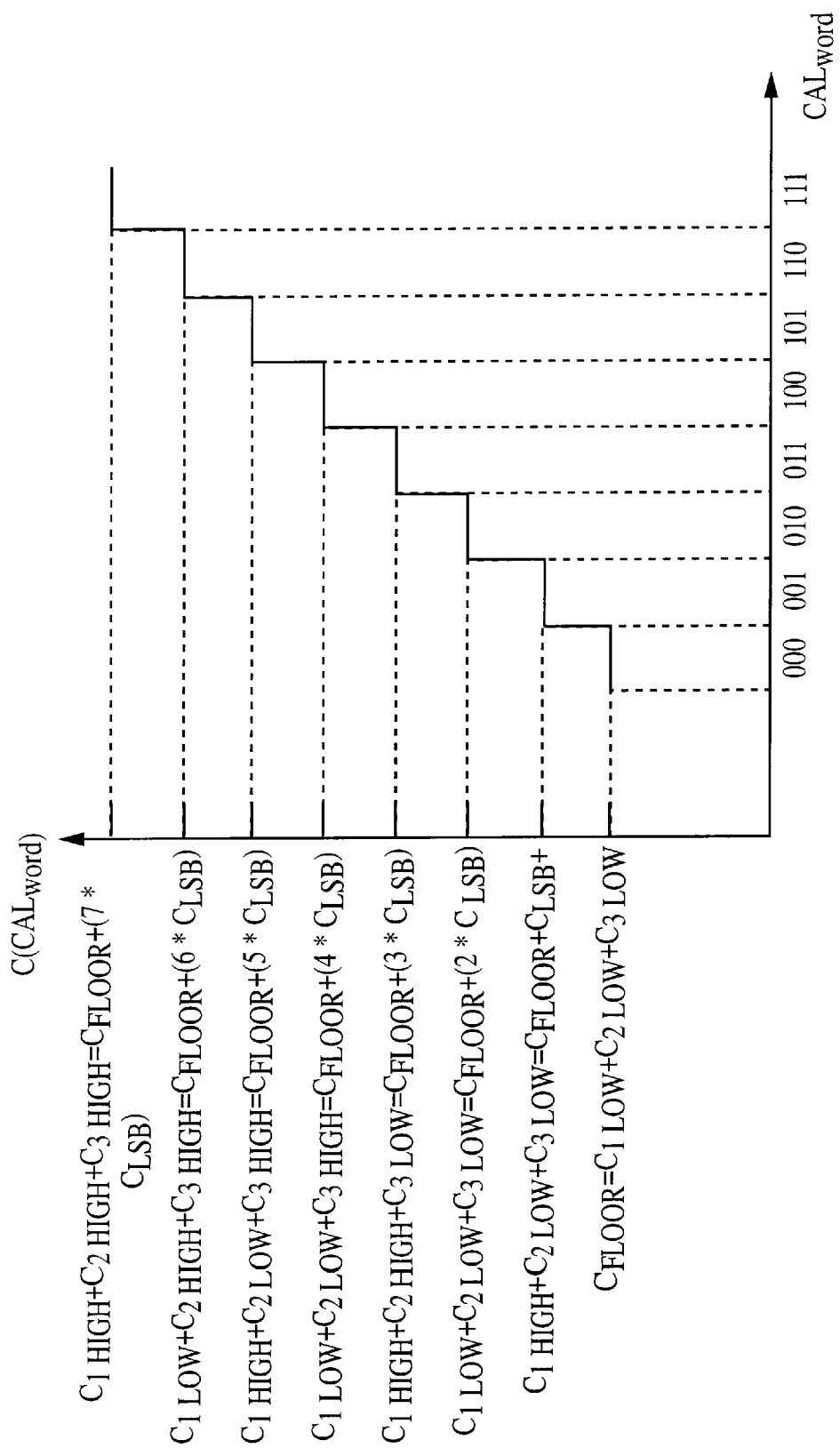

FIG. 5 shows a plot of the capacitance of the digital capacitor 106 as it varies depending upon the digital control word $CAL_{word}$ 114 applied over the terminals of the plurality of binary capacitors. In the example shown, $CAL_{word}$ is assumed to be three bits wide and therefore, in this embodiment, the number of binary capacitors used to implement the digital capacitor 106 is three. As shown in FIG. 5, the lowest capacitance value $C_{FLOOR}$ is produced when the control word $CAL_{word}$ 114 is set equal to all zeros (e.g., assuming a three-bit control word, n=3, $CAL_{word}$=000). Here, $C_{FLOOR}=C_{1\ LOW}+C_{2\ LOW}+C_{3\ LOW}$. The next higher capacitance value is produced using a control word $CAL_{word}$ of "001". In this case, the capacitance of the digital capacitor 106 is equal to $C_{1\ HIGH}+C_{2\ LOW}+C_{3\ LOW}$, or $C_{FLOOR}+C_{LSB}$. By increasing the value of $CAL_{word}$ by one to "010", the capacitance of the digital capacitor 106 is increased to the next step to a value of $C_{1\ LOW}+C_{2\ HIGH}+C_{3\ LOW}$, or $C_{FLOOR}+(2*C_{LSB})$. The digital control word $CAL_{word}$ can be similarly incremented to produce the capacitance plot shown in FIG. 5. The capacitance of the digital capacitor 106 has its highest capacitance $C_{MAX}$ equal to $C_{1\ HIGH}+C_{2\ HIGH}+C_{3\ HIGH}$ when the digital control word $CAL_{word}$ is set equal to "111". Stated in other terms, the highest capacitance $C_{MAX}$ of the digital capacitor is $C_{FLOOR}+(7*C_{LSB})$.

Figure 6:
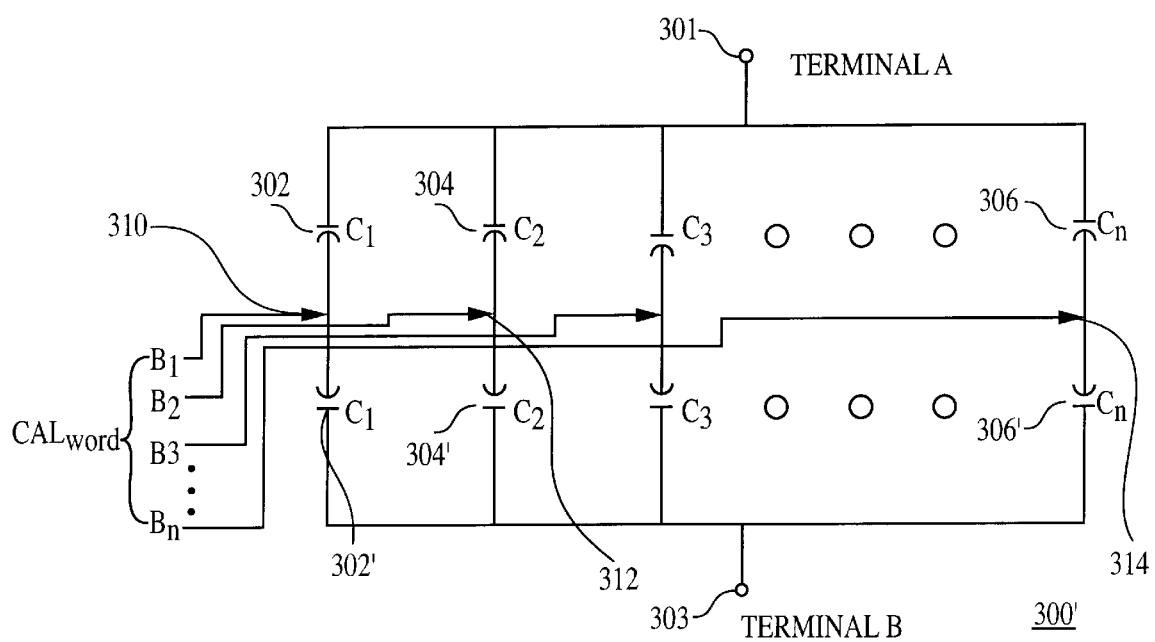

FIG. 6 shows a differential mode implementation of the digital capacitor 106 described above with reference to FIGS. 1–5. The digital capacitor 106 is preferably implemented differentially because this provides a convenient third terminal for digitally controlling the capacitance values of the binary capacitors. For example, as shown in FIG. 6, the control signal $B_1$ is applied between the binary capacitors $C_1$ 302, 302' at a control terminal 310. Similarly, the control signal $B_2$ is applied between the binary capacitors $C_2$ 304, 304' at a control terminal 312. The most significant control bit of the digital control word $CAL_{word}$ 114, $B_n$, is applied between the binary capacitors $C_n$, 306, 306' at a control terminal 314. The control terminals are common mode AC grounds.

The differential mode implementation of the digital capacitor 106 functions similarly to the digital capacitor 106 described above with reference to FIGS. 4–5. For example, the binary capacitors are preferably assigned a binary weighting, with the least significant capacitors $C_1$ 302, 302' having the lowest differential capacitance ($C_{LSB}$). As shown in FIG. 6, the differential capacitance of the binary capacitors 302, 302' is controlled at the control terminal 310 by the LSB of the digital control word $CAL_{word}$, i.e., by $B_1$. The differential capacitance of the next significant binary capacitors $C_2$ 304, 304' is twice that of the least significant capacitors $C_1$, or $2*C_{LSB}$. The capacitance of the binary capacitors $C_2$ 304, 304' is similarly controlled at the control terminal 312 by the next most significant bit of the digital control word $CAL_{word}$, i.e., by $B_2$. The width of the control word $CAL_{word}$ corresponds to the number of binary capacitor pairs used in the differential mode implementation of the digital capacitor 106. The differential capacitance of the most significant binary capacitors is equal to $(2^{n-1}*C_{LSB})$. The MSB of the control word, i.e., $B_n$, controls the differential capacitance of the binary capacitors $C_n$ 306, 306'. Thus, the total capacitance of the differential mode implementation of the digital capacitor 106 is as follows:

$$C_{total}=C_{FLOOR}+B_1'C_{LSB}+B_2'(2*C_{LSB})+B_3'(4*C_{LSB})+\ldots+B_n'*(2^{n-1}C_{LSB});$$

where the control word bits $B_n'$ determine whether the differential capacitance of the $_n$th capacitor ($C_{LSB}$ or a multiple of $C_{LSB}$ in the case when n is higher than 2) is or is not added to $C_{FLOOR}$. More specifically, if $B_n'$ is a logical zero, the differential capacitance of the $_n$th capacitor is not added (i.e., $C_{LSB}$, or its multiple, is not added to $C_{FLOOR}$ for the $_n$th capacitor). If $B_n'$ is a logical one, then the differential capacitance of $C_{LSB}$ (or its multiple in the case of higher order bits) is added to $C_{FLOOR}$ for the $_n$th capacitor.

Thus, by varying the value of the digital control word $CAL_{word}$ 114 appropriately, and thereby varying the capacitance of each individual binary capacitor (i.e., binary capacitor $C_1$ 302, $C_2$ 304, ... $C_n$ 306), the capacitance of the digital capacitor 106 can be customized to any desired value. The step size shown in FIG. 5 (i.e., the resolution of the capacitance of the digital capacitor 106) depends upon the $C_{LSB}$ of the capacitors. When the multi-bit digital capacitor 300 is used in implementing a tuned capacitor in an integrated circuit, the capacitance can be digitally calibrated as desired to meet pre-defined operational parameters.

Applications of the Multi-bit Digital Capacitor in an Integrated Circuit

Figure 1:
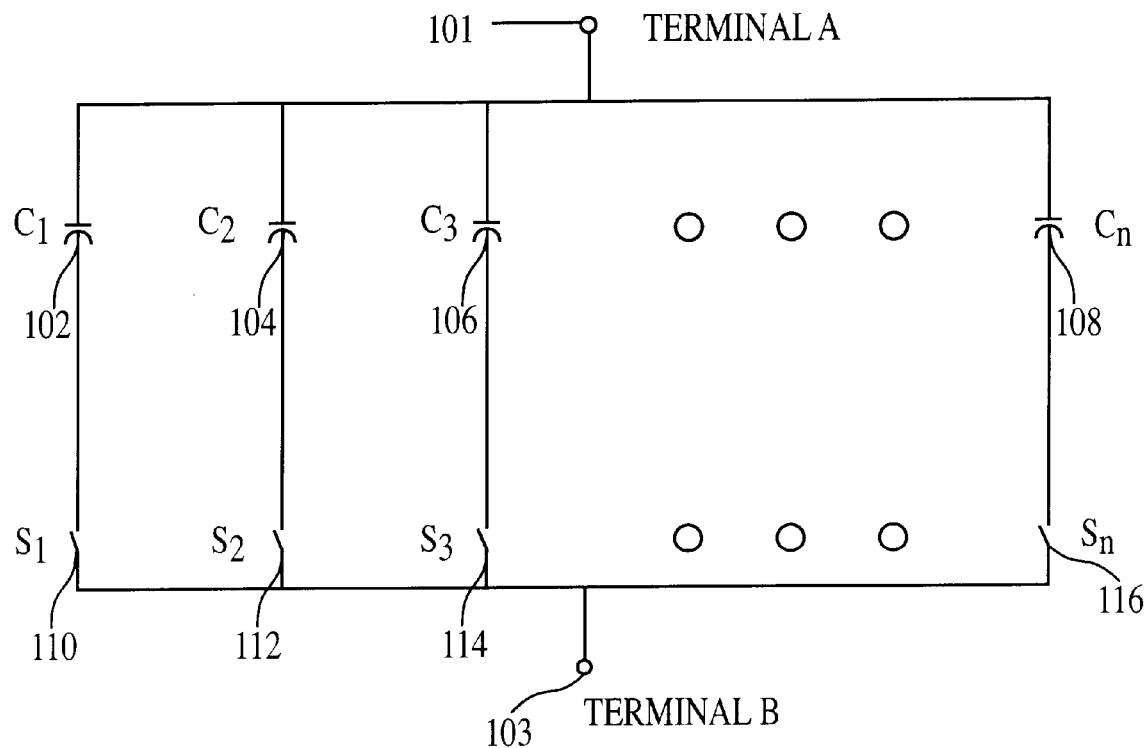
FIG. 1 is a prior art attempt at solving the problem of implementing tuned circuits using on-chip passive electrical devices having poor or unacceptable tolerance values.

The digital capacitor 300 of FIG. 4a and 300' of FIG. 6 can be used in place of the switched-capacitor circuit 100 of FIG. 1 to provide a calibrated capacitor for use in virtually any integrated circuit implementation of a tuned capacitor network. For example, consider the simple differential LC-oscillator circuit 400 shown in FIG. 7. The differential LC-oscillator 400 comprises an LC-resonator circuit 402, an amplifier 404, and a current source 405. As is well known in the electrical engineering art, the resonance frequency of the LC-resonator 402 defines the frequency of oscillation, or the center frequency, of the LC-oscillator 400 and is determined by the values of L and C. More specifically, the oscillation frequency, $f_o=1/(2\pi*SQRT (L*C_{tot}))$.

Disadvantageously, if any of the integrated circuit components used to implement the LC-resonator 402 have poor tolerance values due to process variations or other factors, the oscillation frequency $f_o$ will be adversely affected. This is particularly disadvantageous when the oscillation frequency is relatively high, for example, when the oscillation frequency operates in the Gigahertz range. At such high frequencies, the tolerance variations of the passive electrical components will dramatically affect variations in the oscillation frequency. For example, with a desired oscillation frequency of 2 GHz, a ±10% tolerance will yield an oscillation frequency of 2 GHz ±200 MHz. This may be unacceptable in some applications. In addition, in order to obtain desired performance characteristics such as low phase noise and low power dissipation, the components of the LC-oscillator 400 (i.e., the L and C components) should have low series losses (i.e., the components should have high "Q" gain values).

Figure 7:
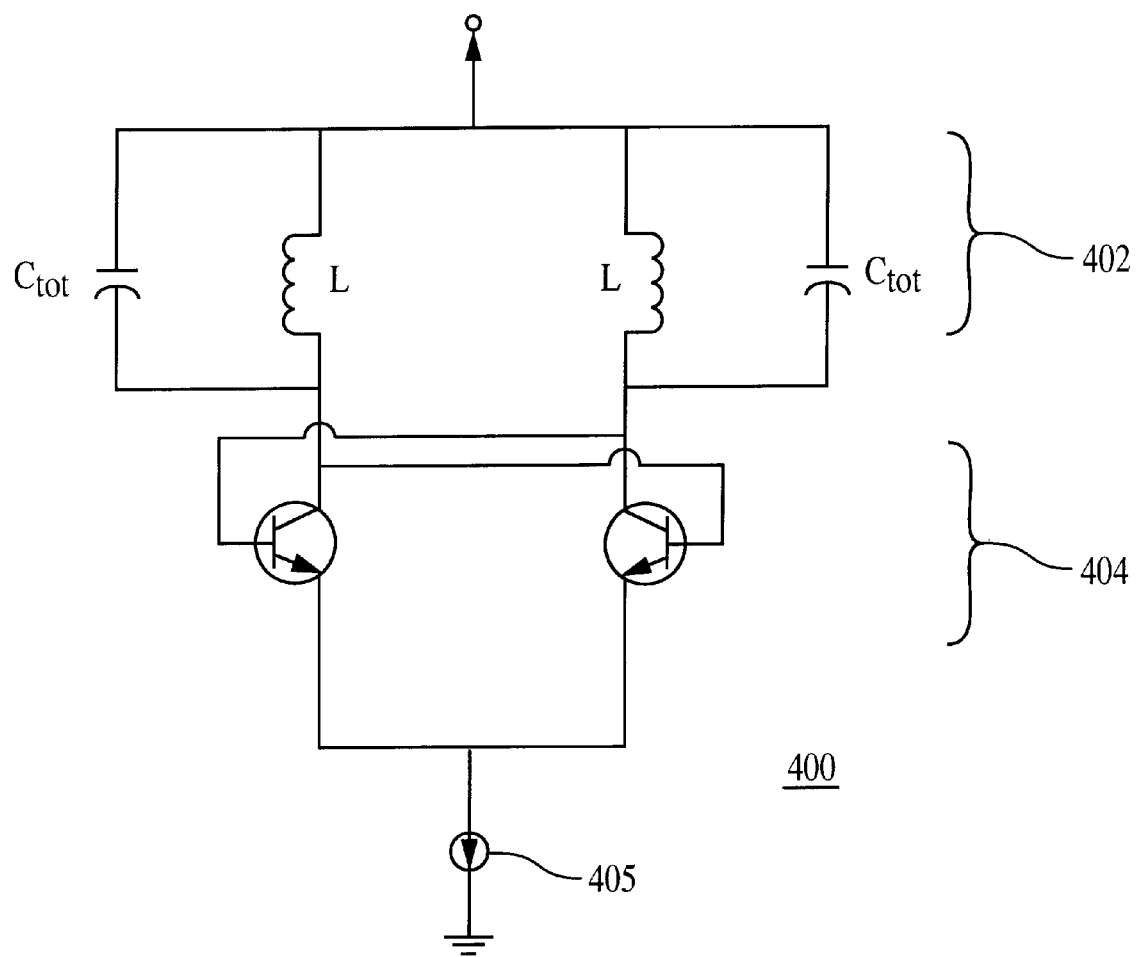
FIG. 7 is a schematic of a simple differential LC-oscillator circuit.
Figure 8:
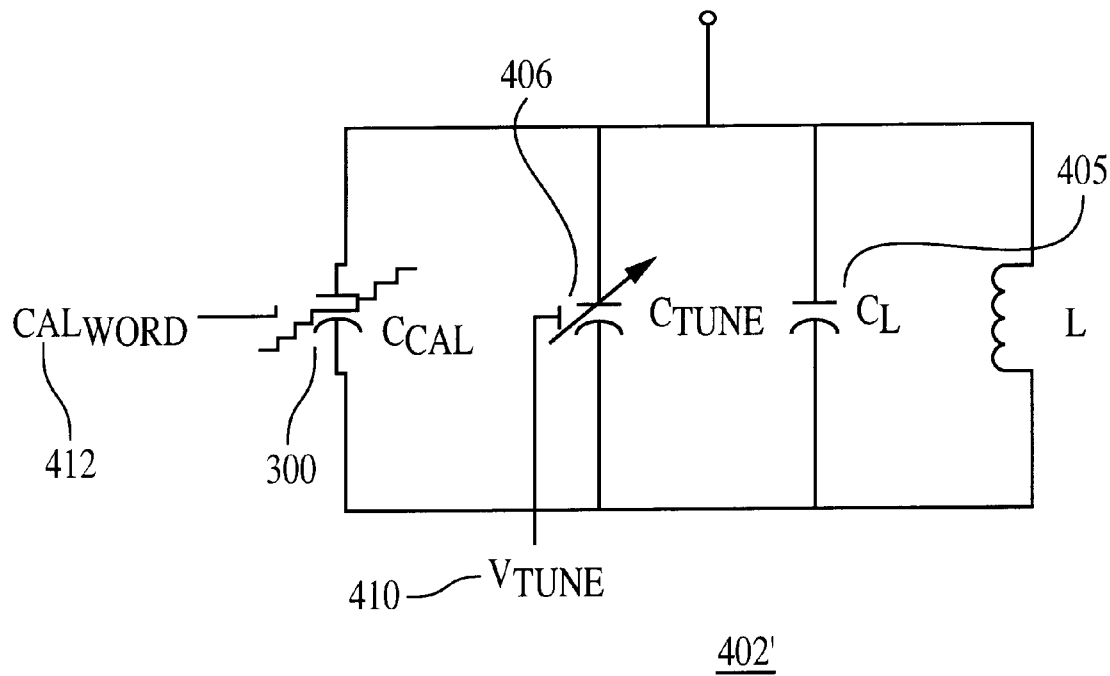
FIG. 8 shows a modified version of the LC-resonator circuit of FIG. 7 wherein the digital capacitor of FIG. 4a is connected in a parallel arrangement with an analog tuning varactor and a fixed LC-tank circuit capacitor.

A modified version 402' of the LC-resonator 402 of FIG. 7 is shown in FIG. 8. The digital capacitor $C_{CAL}$ 300 described above with reference to FIGS. 4a and 4b is connected in a parallel arrangement with an analog tuning varactor 406 and a fixed LC-tank circuit capacitor $C_L$ 408 as shown. As described above with reference to the LC-oscillator 400 of FIG. 7, the resonance frequency of the LC-resonator 402' of FIG. 8 is determined by the values of L and $C_{total}$. More specifically, the oscillation frequency, $f_o = 1/(2\pi * \text{SQRT}(L * C_{total}))$. The value of L remains fixed. Because the digital capacitor 300, the tuning varactor 406, and the fixed capacitor $C_L$ 408 are connected in parallel, their capacitance values add together to yield a total capacitance $C_{total}$ of the LC-resonator 402. That is, $C_{total} = C_{CAL} + C_{tune} + C_L$.

The capacitance $C_L$ 408 is a fixed and known predetermined value. The capacitance $C_{tune}$ is determined by applying a D.C. control voltage $V_{tune}$ 410 to the tuning varactor 406. In practice, $C_{tune}$ is tuned so that the oscillation frequency $f_o$ is nominally equal to a desired center frequency, for example, 2 GHz. However, as described above, in order to compensate for fabrication process variations and other factors, the resonance or oscillation frequency $f_o$ may require calibration in order to re-center the LC-resonance frequency to a desired center frequency value. The digital capacitor $C_{CAL}$ 300 is used for this purpose. By applying an appropriate digital control word $CAL_{word}$ 412 to the digital capacitor 300, the capacitance of the digital capacitor is changed to a desired value, and the center frequency of the LC-resonator 402' is thereby changed accordingly. The oscillation frequency $f_o$ is therefore calibrated and re-centered by appropriately adjusting the digital control word $CAL_{word}$. Calibration of the LC-resonator 402' oscillation frequency $f_o$ can be performed using either manual or automatic methods of calibration.

For example, in one embodiment, the LC-resonator 402' is manually calibrated by first measuring the oscillation frequency $f_o$ during a production testing phase of the integrated circuit fabrication process. In this embodiment, the circuit is tuned to a desired oscillation frequency and the actual output frequency is measured. If the desired oscillation frequency differs from the measured output frequency the digital control word $CAL_{word}$ is modified until the output frequency equals the desired oscillation frequency. The calibration control word thereby determined for $CAL_{word}$ may then be stored in a non-volatile memory either within the same integrated circuit as the resonator or on a printed circuit board adjacent the integrated circuit. In another embodiment, the oscillation frequency $f_o$ is automatically calibrated until a desired oscillation frequency is obtained.

Such an automatic calibration method may be executed every time the circuit is powered on. In one preferred embodiment, the automatic calibration method is executed by a microprocessor or other data processing device located within the integrated circuit or on the same printed circuit board as the integrated circuit. Alternatively, the method can be implemented using any convenient or desirable sequencing device such as a state machine, present state-next state discrete logic, or field programmable gate array device. A more detailed description of the auto-calibration method is described in more detail below together with a description of a self-calibrating VCO made in accordance with the present invention.

Use of the Digital Capacitor in Implementing a VCO in an Integrated Circuit

Figure 9:
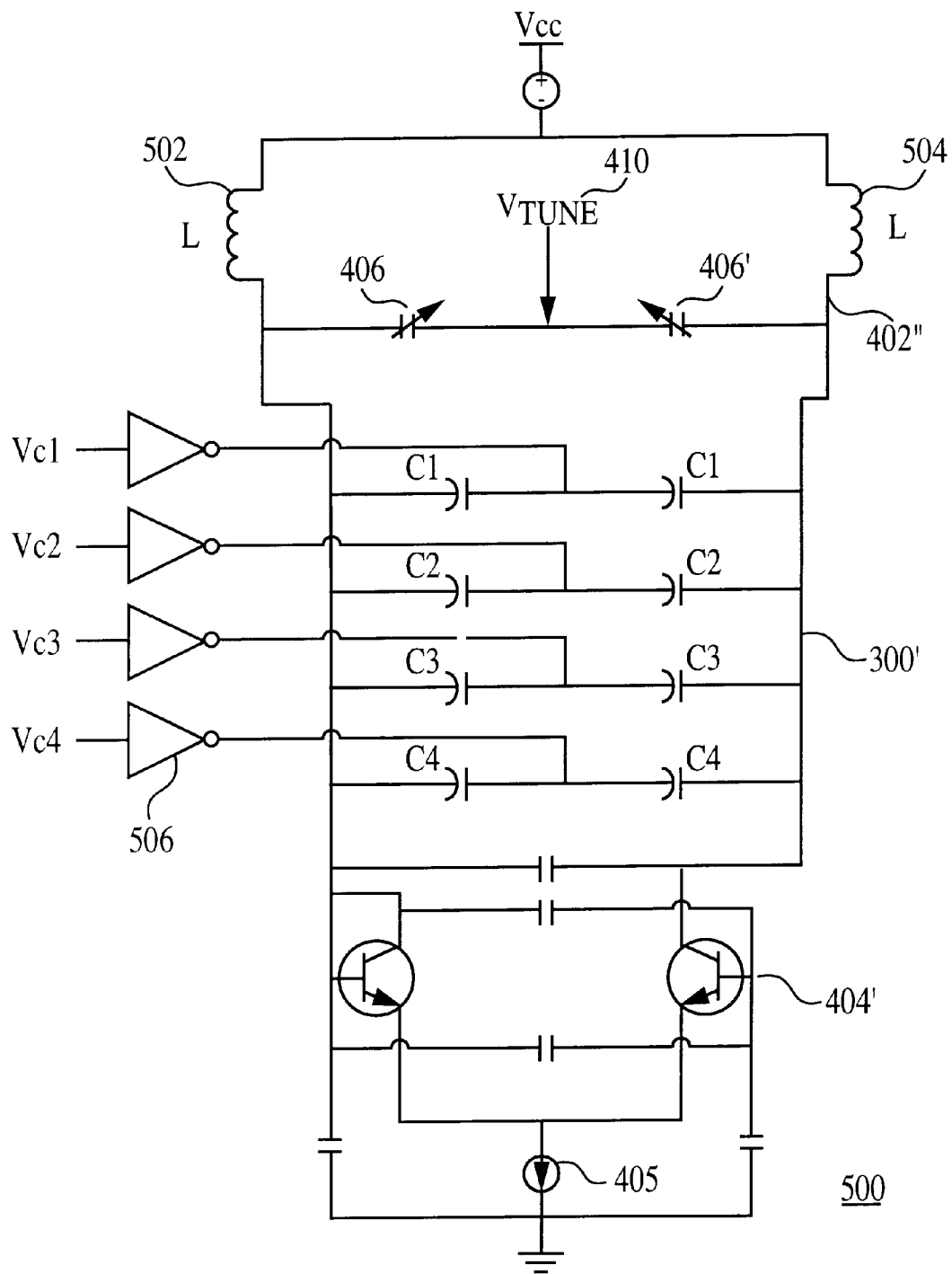
FIG. 9 is a schematic of a calibrating voltage-controlled oscillator (VCO) made in accordance with the present invention.

FIG. 9 shows a schematic of a voltage-controlled oscillator (VCO) made in accordance with the present invention. The VCO 500 shown in FIG. 9 uses both the differential mode implementation of the digital capacitor 300' of FIG. 6 and a differential mode implementation of the LC-resonator 402'' of FIG. 8 to produce a VCO that can be calibrated to generate a desired output frequency $f_o$ based upon a given control voltage and given digital control word. As shown in FIG. 9, one preferred embodiment of the calibrating VCO 500 of the present invention comprises two inductors L 502, 504, the differential mode digital capacitor 300' described in more detail above with reference to FIG. 6, an amplifier 404', and a current source 405. The amplifier 404' functions similarly to the amplifier 404 of FIG. 7. Similarly, the binary capacitors (e.g., the LSB binary capacitor $C_1$ 302, 302', next-significant binary capacitor $C_2$ 304, 304', and MSB binary capacitor $C_4$ 306, 306') function similarly to their respective and corresponding binary capacitors described above with reference to the differential mode digital capacitor of FIG. 6.

Figure 10:
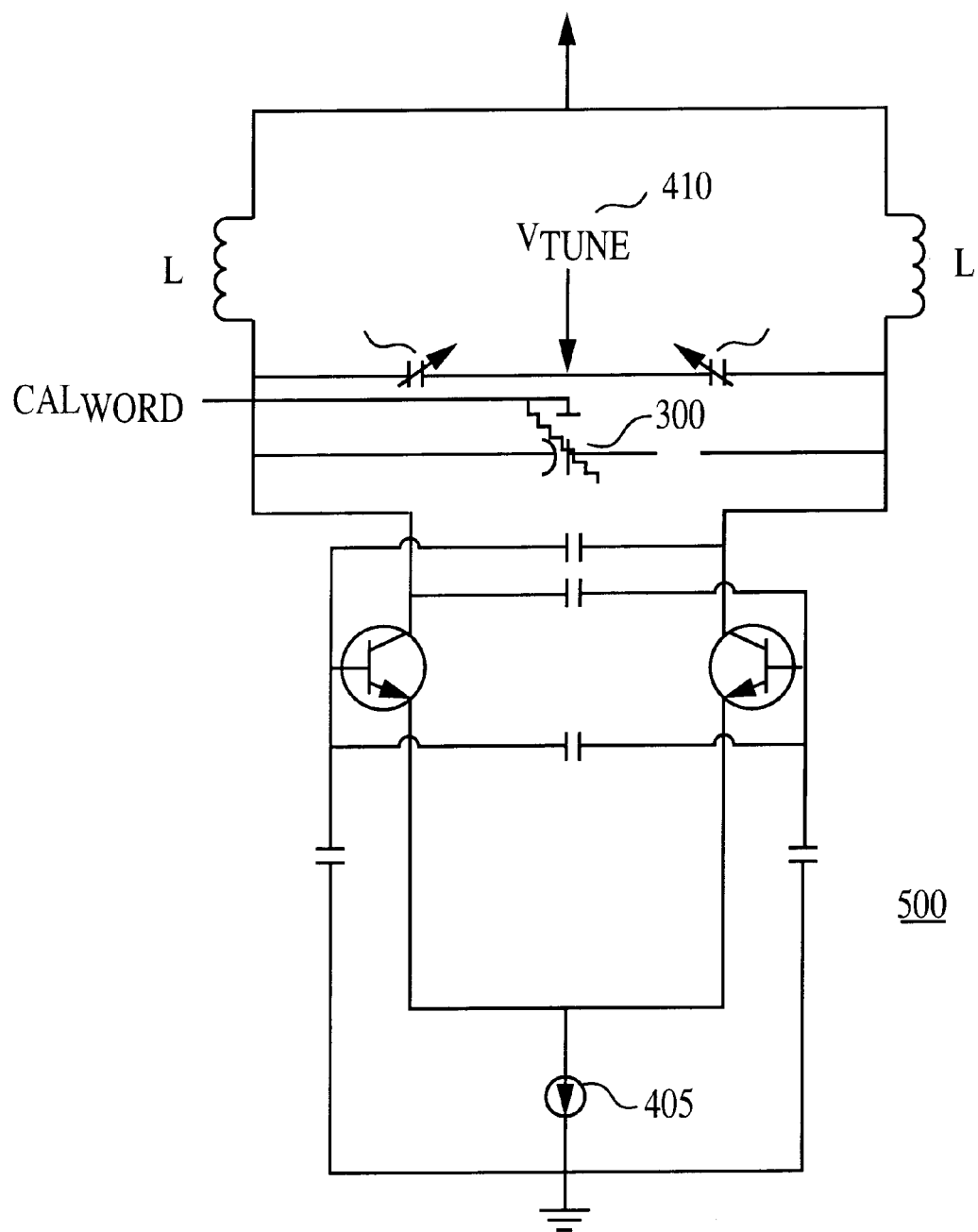
FIG. 10 is a simplified schematic of the calibrating VCO of FIG. 9 using a simplified schematic representation of the digital capacitor of the present invention.

In the VCO of FIG. 9, the capacitance of the binary capacitors are controlled by a digital control word (comprising $VC_{1\ (LSB)}$, $VC_2$, $VC_3$, and $VC_{4\ (MSB)}$) that is buffered by associated and corresponding buffers 506. FIG. 10 is a simplified schematic of the calibrating VCO 500 of FIG. 9 using the simplified schematic representation of the digital capacitor 300'. Similar to the operation of the LC-resonator 402' of FIG. 8, the oscillation or output frequency $f_o$ of the VCO 500 is established by appropriately adjusting the analog tuning voltage $V_{tune}$ 410 to a desired D.C. voltage level. Fabrication process variations can be compensated and the oscillation frequency $f_o$ can be calibrated and re-centered by thereafter varying the digital control word $CAL_{word}$ and thereby adjusting the capacitance of the digital capacitor 300'. Advantageously, despite process variations in the fabrication of integrated circuits, the inventive VCO 500 of FIGS. 9 and 10 allows circuit designers to accurately control the center frequency of the integrated circuit VCO. This is essential in some applications, especially when the VCO operates at relatively high frequencies.

In addition, given a set of tunable frequency ranges, the present invention provides a VCO having much lower gain and sensitivity characteristics than prior art VCO designs. Owing to the calibration function provided by the digital capacitor 300', the calibrating VCO 500 need be tunable only over a relatively narrow frequency range (i.e., the VCO only has to cover the frequency band of interest) as compared with the prior art VCO designs. Therefore, the present inventive VCO 500 is much less sensitive to noise than are the prior art VCO designs. The present VCO 500 performs better and is easier to implement that its prior art counterparts because it is less sensitive to low frequency noise and the deleterious effects of interfering RF signals.

Figure 11:
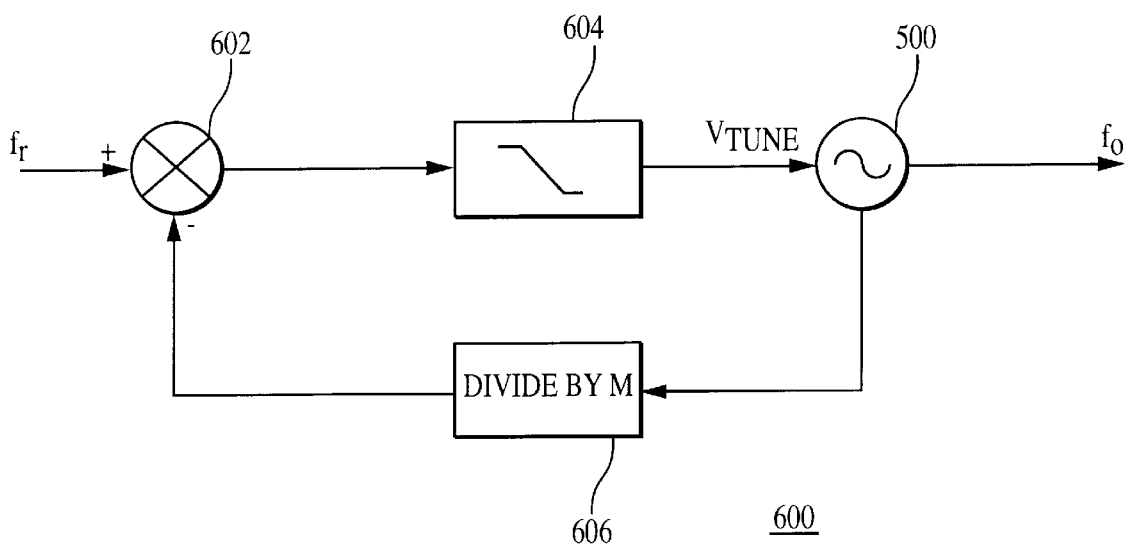
FIG. 11 is a simplified block diagram of a phase locked loop (PLL) circuit 600 using the VCO of FIGS. 9 and 10.

FIG. 11 is a simplified block diagram of a phase locked loop (PLL) circuit 600 that uses the VCO 500 described above with reference to FIGS. 9 and 10. As shown in FIG. 11 the preferred embodiment of the PLL 600 comprises a multiplier or phase error detector 602, a loop filter 604, the VCO 500, and a divide-by-M circuit 606. The PLL 600 functions in a well-known manner to generate an output frequency $f_o$ that is locked in phase with a precision reference signal $f_r$. The PLL 600 is a negative feedback system. The reference signal $f_r$ and the output of the divide-by-M circuit 606 are applied to the inputs of the multiplier 602 as shown in FIG. 11. The multiplier 602 produces both a high frequency and a low-frequency component. The high frequency component is eliminated by the combination of the loop filter 604 and the VCO 500. The low frequency component output by the multiplier 602 contains information related to the phase error or difference in phase between the reference signal $f_r$ and the divided down output signal $f_o$ (i.e., the output of the VCO 500 as divided-down by the divide-by-M circuit 606). This phase error signal is filtered and used (as the tuning voltage $V_{tune}$) to control the frequency produced by the VCO 500. The output signal generated by the VCO 500 is fed back to the divide-by-M circuit 606 thereby closing the PLL negative feedback loop.

When the phase error produced at the output of the multiplier 602 is zero, the PLL 600 is in a phase-lock condition. The VCO output signal $f_o$ is a multiple of the reference signal $f_r$, specifically $f_o = M * f_r$. Due to the negative feedback operation of the PLL 600 described above, the output signal $f_o$ tracks or follows the reference signal $f_r$. In the embodiment shown in FIG. 11, the reference frequency $f_r$ is maintained at a desirable base frequency, while the output center frequency $f_o$ is varied by varying the value of "M" in the divide-by-M circuit 606 (i.e., M can be assigned the values of $M_1$, $M_2$, $M_3$, etc., with each M-value having an associated and corresponding output center frequency $f_{o1}$, $f_{o2}$, $f_{o3}$, etc.).

When the VCO 500 is used in a radio communication system designed in accordance with the proposed "Bluetooth" standard, the VCO 500 must be capable of generating output signals having a frequency range of at least 78 MHz (i.e., the tunable range of the VCO must be at least 78 MHz), starting at 2.402 GHz and stopping at 2.48 GHz. Spectrum spreading in Bluetooth is accomplished in 79 frequency channel hops displaced by 1 MHz per frequency channel. The VCO 500 must therefore be capable of generating output signals corresponding to the transmit and receive frequency channels used in Bluetooth. However, it is desirable to reduce the gain of the VCO in order to reduce sensitivity to low-frequency noise signals. In one embodiment, the gain of the VCO 500 is approximately 50 MHz and the maximum tunable range of the VCO 500 is 300 MHz. In this embodiment, $f_r$ is maintained at a base frequency of approximately 1 MHz. By changing the value of M in the divide-by-M circuit 606, the VCO 500 generates multiple output channels separated by the 1 MHz reference frequency. More specifically, in an embodiment designed for use in a Bluetooth system, the output frequency varies between 2.402 GHz and 2.48 GHz at a 1 MHz channel spacing.

However, those skilled in the art will recognize that the VCO 500 of the present invention can be modified for use in a wide variety of applications without departing from the scope of the claims. For example, the tuning range and the output frequency channels generated by the inventive VCO 500 can be modified for use in a wideband communication system simply by changing the reference frequency, the value of M in the divide-by-M circuit 606, and the value of $CAL_{word}$. In one wideband communication system contemplated for use with the present inventive VCO 500, the VCO tuning range is approximately 300 MHz and the frequency channels are separated by approximately 16 MHz-wide steps. The inventive VCO 500 can also be used in applications such as use in implementing tunable filters.

Automatic Calibration of the VCO Center Frequency $f_o$

Figure 12:
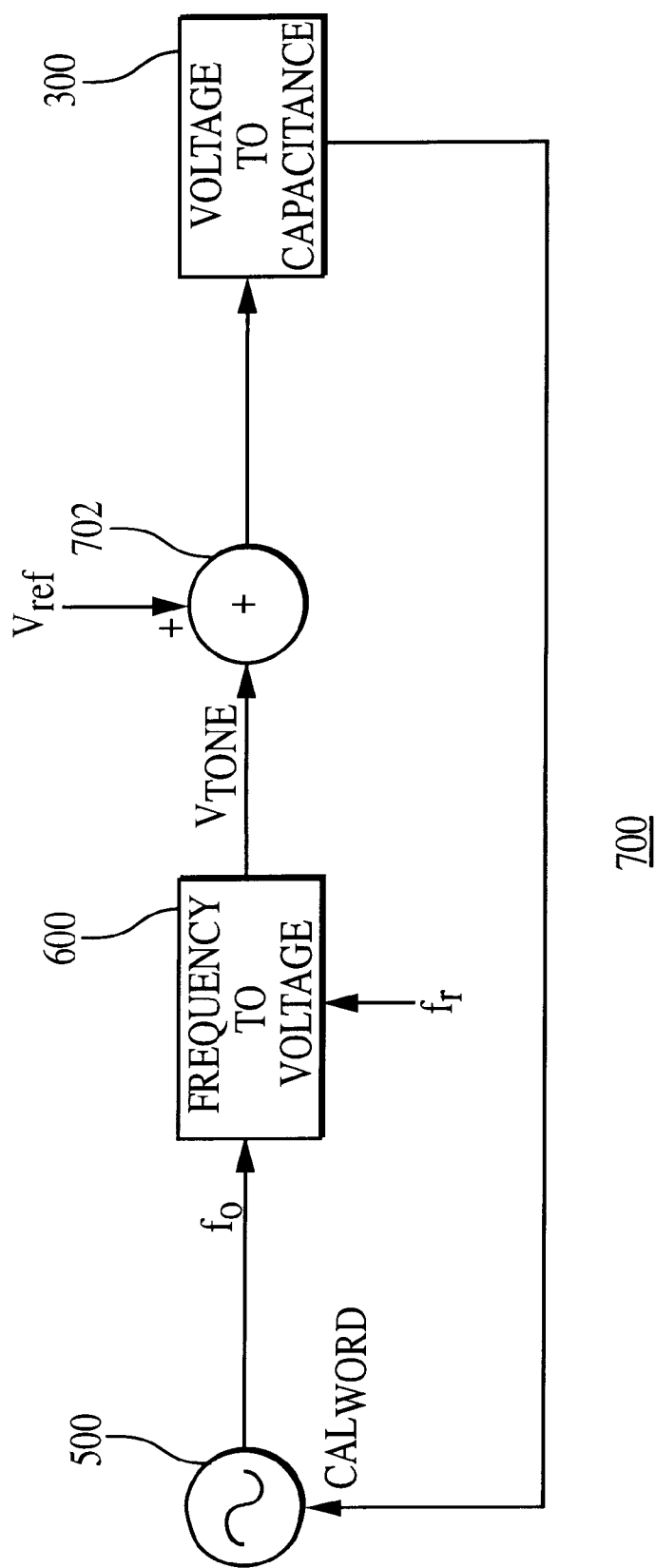
FIG. 12 is a simplified block diagram demonstrating the principles of auto-calibration of the output center frequency of the inventive VCO of FIGS. 9 and 10.

In one embodiment of the present invention, the output center frequency $f_o$ generated by the VCO 500 is automatically calibrated to fall approximately in the center of the VCO tuning range (i.e., centered between the minimum and maximum values of the tuning voltage $V_{tune}$ that is applied to the control input of the VCO 500). FIG. 12 shows a simplified block diagram that demonstrates the principles of auto-calibration of the VCO center frequency. As shown in FIG. 12, the VCO 500 generates an output frequency $f_o$ that is input to the phase locked loop circuit 600 described above with reference to FIG. 11. The PLL 600 performs a frequency-to-voltage conversion function whereby the output frequency $f_o$ is compared with a reference frequency fr to generate the tuning voltage $V_{tune}$. The tuning voltage $V_{tune}$ is subsequently compared by a comparator 702 with a reference or threshold voltage $V_{ref}$ as shown in FIG. 12. The total capacitance of the LC-resonator circuit (FIG. 8) within the VCO 500 is modified based upon the comparison of the tuning voltage $V_{tune}$ with the reference or threshold voltage $V_{ref}$. This voltage-to-capacitance function is performed by the digital capacitor circuit 300, and specifically by updating the digital control word $CAL_{word}$. Thus, by periodically monitoring the input tuning voltage $V_{tune}$, and by comparing the tuning voltage to a threshold voltage, the VCO output center frequency can be automatically calibrated.

Figure 13:
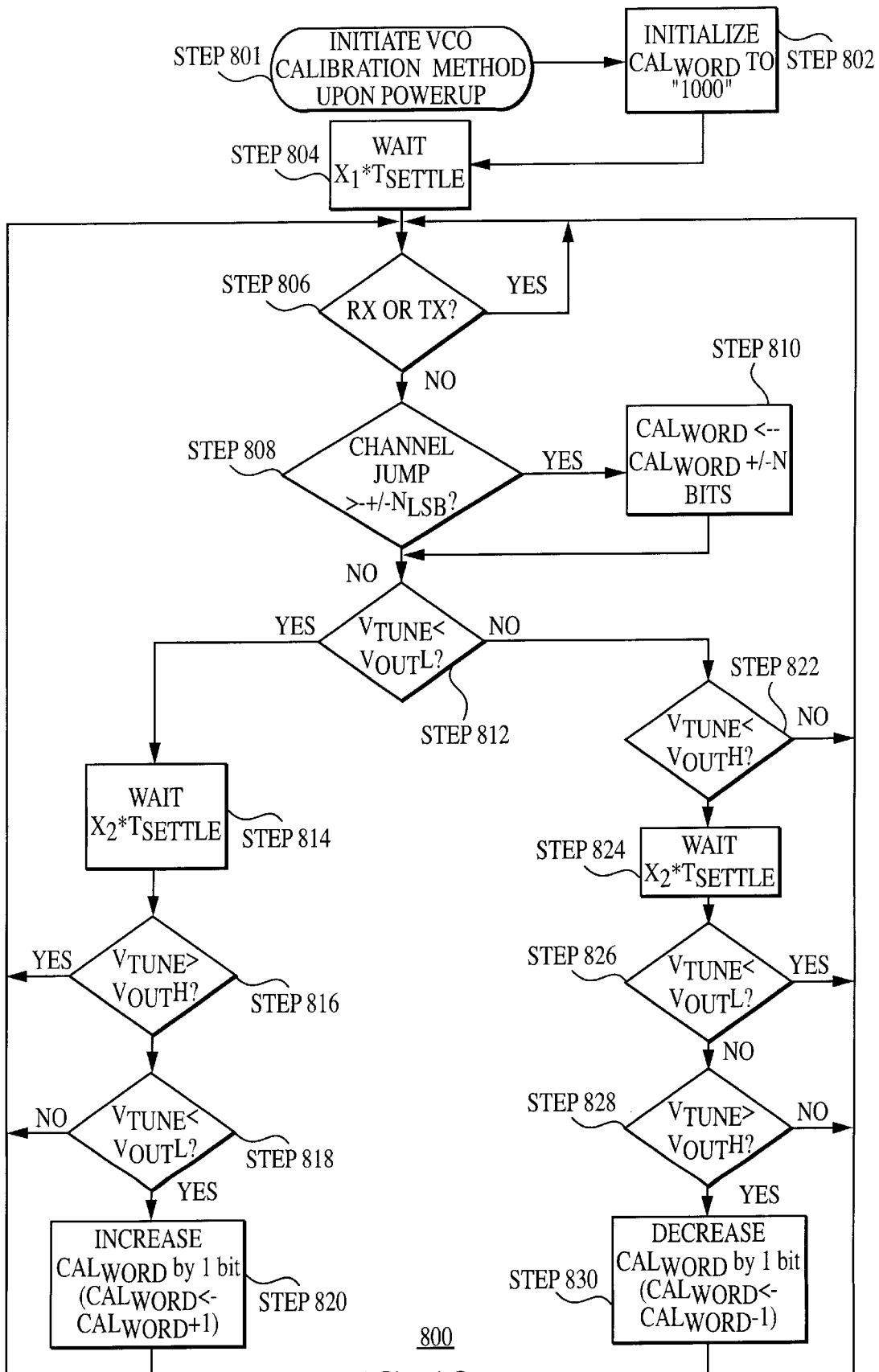
FIG. 13 shows a flowchart of one embodiment of a VCO center frequency auto-calibration method in accordance with the present invention.

FIG. 13 shows a flowchart of one embodiment of a VCO center frequency auto-calibration method 800 in accordance with the present invention. In one embodiment of the present invention, the method 800 shown in FIG. 13 is implemented in software instructions that are executed by a microprocessor, state machine, or other digital logic device operatively coupled to the inventive VCO 500. However, those skilled in the digital control art will recognize that the method 800 may also be implemented in hardware, or by use of discrete logic circuits. As shown in FIG. 13, the VCO auto-calibration method 800 is initiated at STEP 801 when the VCO 500 is first powered on (i.e., after the VCO 500 enters a "powerup" state). The method 800 proceeds to a STEP 802 whereat the digital control word $CAL_{word}$ is initialized to a predetermined value. In the embodiment shown in FIG. 13, $CAL_{word}$ is initialized to a value that is halfway between its maximum number (binary "1111") and its minimum number (binary "0000"), that is, $CAL_{word}$ is set to a binary "1000". The inventive VCO auto-calibration method 800 then proceeds to a waiting STEP 804 whereat the method waits for a predetermined "settling" period of time.

The method waits for the pre-determined "settling" period (shown as a scaling factor $X_1$ multiplied by a settling time $T_{settle}$) in order to allow the VCO 500 and the PLL 600 (FIG. 11) to settle after the powerup condition and to thereafter establish a nominal output frequency. The settling time can be determined experimentally and adjusted to meet the needs of specific VCO designs. In the embodiment shown in FIG. 13, after waiting the pre-determined settling period, the method 800 proceeds to a STEP 806 whereat a decision is made as to whether the radio system utilizing the VCO 500 is operating within a receive or transmit time slot. One preferred application for the present inventive VCO 500 is use in a frequency hop transceiver capable of generating receive and transmit frequencies in a wireless Time-Division Duplex scheme. One exemplary application of the inventive VCO 500 is in a radio system designed according to the proposed Bluetooth standard. When the VCO 500 is used in such a system the method 800 preferably prevents calibration of the VCO during the time slots that voice/data is being received or transmitted (i.e., during the Rx and Tx time slots). Accordingly, as shown in FIG. 13, if the VCO is currently operating in a receive/transmit time slot, the decision STEP 806 "yes" output will be followed and the VCO 500 will not be calibrated. The method 800 will continue to loop back to the decision STEP 806 until the VCO is no longer operating in a receive/transmit time slot.

When the receive/transmit time slot is no longer active, the method proceeds to a decision STEP 808 and determines whether a "channel jump" or "channel hop" condition exits. In a communication system designed according to the proposed Bluetooth standard as described above, certain time slots are dedicated for frequency or channel "hopping." Consequently, when the inventive auto-calibration method 800 determines that a channel hop has occurred in the STEP 808, and that the channel frequency change or channel hop delta is greater than a pre-determined threshold, the method preferably proceeds to a STEP 810 and updates the digital control word $CAL_{word}$ to reflect the corresponding change in output frequency. More specifically, in the embodiment shown in FIG. 13, a determination is made at the decision STEP 808 as to whether the channel frequency was increased or decreased by a factor of n* LSB; wherein n is an integer and "LSB" is a pre-defined frequency resolution determined by the least significant bit of the digital control word $CAL_{word}$.

For example, in one embodiment of the present invention, one LSB of the digital control word $CAL_{word}$ changes the VCO 500 output frequency $f_o$ by 30 MHz. In such an embodiment, if the channel jump detected in STEP 808 is greater than or equal to 30 MHz (i.e., greater than plus or minus 1 LSB), then $CAL_{word}$ is updated accordingly at STEP 810 to change the center frequency of the VCO 500. Similarly, if the channel jump is greater than 60 MHz (i.e., greater than plus or minus 2 LSB), the $CAL_{word}$ is updated in STEP 810 to change the center frequency $f_o$ of the VCO by 60 MHz. Those skilled in the VCO art will appreciate that the STEPS 806, 808 and 810 can be eliminated when the VCO is not designed for use in a Time-Division Duplex wireless communication system having frequency or channel hopping. For more general use, the method 800 of FIG. 13 proceeds directly from the waiting STEP 804 to a decision STEP 812.

The remainder of the inventive VCO auto-calibration method monitors the VCO analog tuning voltage $V_{tune}$ and determines whether the VCO output frequency $f_o$ requires calibration. For example, at the decision STEP 812, the method determines whether the analog tuning voltage $V_{tune}$ is less than a pre-determined $V_{out}$ "low threshold" value "$V_{out}L$." In some situations, especially when the VCO 500 is first powered on, the PLL 600 can become locked into a condition wherein the output frequency $f_o$ is saturated to a given high frequency, and the analog tuning voltage becomes locked below a low threshold voltage of $V_{out}L$. In this scenario, the method will modify the digital control word $CAL_{word}$ and thereby decrease the output frequency $f_o$ generated by the VCO 500. The method will increase the digital control word $CAL_{word}$ to thereby decrease the output frequency, which, due to the negative feedback of the PLL 600, will, in turn, increase the analog tuning voltage $V_{tune}$.

If the method determines at STEP 812 that the analog tuning voltage $V_{tune}$ is greater than the low threshold value $V_{out}L$, then the method proceeds to a decision STEP 822 whereat it determines whether the analog tuning voltage $V_{tune}$ is greater than a pre-determined $V_{out}$ "high threshold" value "$V_{out}H$." As described above, in some situations, especially when the VCO 500 is first powered on, the PLL 600 can become locked into a condition wherein the output frequency $f_o$ is saturated to a given low frequency, and the analog tuning voltage becomes locked above a high threshold voltage $V_{out}H$. In this scenario, the method will modify the digital control word $CAL_{word}$ and thereby modify the output frequency $f_o$ generated by the VCQ 500. The method will decrease the digital control word $CAL_{word}$ and thereby increase the output frequency, which, due to the negative feedback of the PLL 600, will decrease the analog tuning voltage $V_{tune}$. The remainder of the method 800 is now described in more detail.

If a determination is made at the decision STEP 812 that $V_{tune}$ is less than the pre-determined low threshold voltage $V_{out}L$ (i.e., the outcome of the decision step is "yes"), the method proceeds to a waiting STEP 814 and waits for a pre-determined period of time for the output frequency of the VCO to settle. For example, as shown in FIG. 13, at the STEP 814 the method waits for a time period equal to a scaling factor "$X_2$" multiplied by a pre-defined settling time $T_{settle}$ to allow the VCO 500 to settle. In one embodiment of the present invention, the waiting time provided by STEP 814 is approximately 100 microseconds. However, those skilled in the VCO design art shall recognize that both the scaling factor $X_2$ and the settling time $T_{settle}$ can be modified to accommodate various VCO designs without departing from the scope of the present invention.

The method 800 waits during the waiting STEP 814 to determine whether the tuning voltage $V_{tune}$ is still less than the low threshold voltage $V_{out}L$, and therefore whether the VCO still requires calibration. The method proceeds from the STEP 814 to a decision STEP 816 to determine whether the analog tuning voltage $V_{tune}$ is greater than the pre-defined high threshold $V_{out}H$. If $V_{tune}$ is greater than $V_{out}H$, the method returns to the STEP 806 and proceeds as described above. However, if $V_{tune}$ is less than $V_{out}H$ the method proceeds to decision STEP 818 to once again determine if the analog tuning voltage $V_{tune}$ is less than the low threshold $V_{out}L$. If not, there is no reason to calibrate the VCO 500, and the method returns to the STEP 806 and proceeds as described above. However, if $V_{tune}$ is still less than the low threshold voltage $V_{out}L$, the method proceeds to the STEP 820 to calibrate the VCO 500. As shown in FIG. 13, calibration of the VCO 500 is preferably accomplished by modifying the digital control word $CAL_{word}$. In this case, calibration is accomplished by increasing $CAL_{word}$ by one bit (i.e., $CAL_{word} \leftarrow CAL_{word}+1$). Increasing $CAL_{word}$ by one bit causes the VCO output frequency to decrease, which, due to the negative-feedback operation of the PLL 600, causes the tuning voltage $V_{tune}$ to increase. The method then returns to the STEP 806 to determine whether further calibration is required.

The right side of the flowchart shown in FIG. 13 operates in a similar manner to decrease $CAL_{word}$ when the analog tuning voltage $V_{tune}$ is determined to be greater than a pre-defined high threshold voltage $V_{out}H$. Specifically, the method 800 waits during a STEP 824 to determine whether the tuning voltage $V_{tune}$ is still greater than the high threshold voltage $V_{out}H$, and therefore whether the VCO still requires calibration. The method proceeds from the STEP 824 to a decision STEP 826 to determine whether the analog tuning voltage $V_{tune}$ is less than the pre-defined low threshold $V_{out}L$. If $V_{tune}$ is less than $V_{out}L$, the method returns to STEP 806 and proceeds as described above. However, if $V_{tune}$ is greater than $V_{out}L$, the method proceeds to a decision STEP 828 to once again determine if the analog tuning voltage $V_{tune}$ is greater than the high threshold voltage $V_{out}H$. If not, there is no reason to calibrate the VCO 500, and the method returns to the STEP 806 and proceeds as described above. However, if $V_{tune}$ is still greater than the high threshold voltage $V_{out}H$, the method proceeds to the STEP 830 to calibrate the VCO 500. As described above, calibration of the VCO 500 is accomplished by modifying the digital control word $CAL_{word}$. In this case, calibration is accomplished by decreasing $CAL_{word}$ by one bit (i.e., $CAL_{word} \leftarrow CAL_{word}-1$). Decreasing $CAL_{word}$ by one bit causes the VCO output frequency to increase, which, due to the negative-feedback operation of the PLL 600, causes the tuning voltage $V_{tune}$ to decrease. The method then returns to the STEP 806 to determine whether further calibration is required.

Summary

In summary, the invention includes a digital or binary capacitor comprised of a MOS-FET device wherein the gate-to-bulk capacitance of the MOS-FET device exhibits dependency to the D.C. voltage applied between its gate and well implant regions. The capacitance-voltage characteristic of the binary capacitor has three major regions: (1) a first relatively flat region where there is little or no voltage dependency and where the capacitance equals a first low capacitance of $C_1$; (2) a sloped region wherein a voltage dependency exists; and (3) a second relatively flat region where there is little or no voltage dependency and where the capacitance equals a second higher capacitance of $C_2$. The capacitance of the binary capacitor can be changed from $C_1$ to $C_2$ simply by changing the polarity of the applied D.C. voltage from a positive to a negative value.

A plurality of binary capacitors are configured in a parallel arrangement to produce a digitally-controlled capacitor. The digitally-controlled capacitor can be used in any integrated circuit requiring a tightly controlled tuned network. One application is a voltage-controlled oscillator (VCO) wherein the center output frequency of the VCO is calibrated by digitally modifying the capacitance of the VCO's digitally controlled capacitor. A means for determining whether the VCO requires calibration and a means for calibrating the center output frequency of the VCO is presented. Consequently, the inventive VCO can be implemented in an integrated circuit design despite poor tolerance values typically associated with process variations in integrated circuit fabrication. The present invention advantageously increases the effectiveness of integrated circuit VCO designs, tuning networks, and the like. The present invention improves the performance of wireless communication devices without requiring the use of expensive and large discrete components. The present invention is particularly useful in broadband wireless digital communication systems such as CDMA cellular systems, however it can also find utility in other digital cellular communication systems such as those made in accordance with the proposed Bluetooth standard.

A number of embodiments of the present invention have been described. Nevertheless, it will be understood that various modifications may be made without departing from the spirit and scope of the claimed invention.

Accordingly, it is to be understood that the invention is not to be limited by the specific illustrated embodiment, but only by the scope of the appended claims.

What is claimed is:

1. A digital capacitance apparatus coupled to a predetermined number, N, of control signals, wherein the capacitance across the digital capacitance apparatus has at least $2^N$ distinct values, the digital capacitance apparatus including:
   a) N multiple capacitance level two terminal capacitors coupled in parallel, each multiple capacitance level capacitor having a plurality of steady-state capacitance levels,
   b) wherein each multiple capacitance level capacitor is operatively coupled to an associated and corresponding one of N control signals, and wherein the steady-state capacitance level across each multiple capacitance level capacitor varies as a function of the corresponding control signal.

2. The apparatus according to claim 1, wherein the N control signals each have a first and second predetermined value, and wherein each capacitor has a first steady-state capacitance level when the corresponding control signal is less than or equal to the first predetermined value and has a second steady-state capacitance level when the corresponding control signal is greater than or equal to the second predetermined value.

3. The apparatus according to claim 2, wherein the N control signals are voltage control signals.

4. The apparatus according to claim 2, wherein the difference between the first steady-state capacitance level and the second steady-state capacitance level for each capacitor is the differential capacitance of the capacitor and each of the N capacitors has a different differential capacitance.

5. The apparatus according to claim 4, wherein the differential capacitance of the N capacitors is ordered from a lowest differential capacitance to a highest differential capacitance, the N control signals form a digital control word, and the control signal of the N control signals that is coupled to the capacitor having the lowest differential capacitance is the least significant bit "LSB" of the control word formed from the N control signals.

6. The apparatus according to claim 4, wherein each multiple capacitance level capacitor is coupled to another multiple capacitance level capacitor in series.

7. The apparatus according to claim 6, wherein the corresponding control signal for each multiple capacitance level capacitor is applied between the capacitor and another capacitor in series with the capacitor.

8. The apparatus according to claim 5, wherein the control signal of the N control signals that is coupled to the multiple capacitance level capacitor having the highest differential capacitance is the most significant bit "MSB" of the control word formed from the N control signals.

9. The apparatus according to claim 8, wherein the ratio of the differential capacitance of the capacitor having the lowest differential capacitance to the differential capacitance of the capacitor having the next lowest differential capacitance is approximately equal to a predetermined number.

10. The apparatus according to claim 8, wherein the ratio of the differential capacitance of the capacitor having the lowest differential capacitance to the differential capacitance of the capacitor having the next lowest differential capacitance is approximately equal to two.

11. The apparatus according to claim 10, wherein the capacitor having the next lowest differential capacitance includes two capacitors in parallel wherein each of the two capacitors in parallel has the lowest differential capacitance.

12. The apparatus according to claim 8, wherein the ratio of the differential capacitance of the capacitor having the lowest differential capacitance to the differential capacitance of the capacitor having the next lowest differential capacitance is approximately equal to ten.

13. The apparatus according to claim 8, wherein the ratio of the differential capacitance of the capacitor having the Nth lowest differential capacitance to the differential capacitance of the capacitor having the (N−1)th lowest differential capacitance is approximately equal to a fixed predetermined number for N equal from 1 to (N−1).

14. The apparatus according to claim 8, wherein the ratio of the differential capacitance of the capacitor having the Nth lowest differential capacitance to the differential capacitance of the capacitor having the (N−1)th lowest differential capacitance is approximately equal to two for N equal from 1 to (N−1).

15. The apparatus according to claim 8, wherein the ratio of the differential capacitance of the capacitor having the Nth lowest differential capacitance to the differential capacitance of the capacitor having the (N−1)th lowest differential capacitance is approximately equal to ten for N equal from 1 to (N−1).

16. The apparatus according to claim 1 wherein the plurality of capacitors are formed on an integrated circuit "IC".

17. The apparatus according to claim 16, the IC including:
 a) one of an N-well and P-well implant layer formed in a first semiconductor layer;
 b) a region of one of a N+ and a P+ implant formed in the one of an N-well and P-well implant layer;
 c) an insulating layer formed over a portion of the surface of the one of an N-well and P-well implant layer; and
 d) a second semiconductor layer formed over a portion of the surface of the insulating layer, wherein the insulating layer is positioned between the second semiconductor layer and the region of one of N+ and P+ implants, and wherein the second semiconductor layer forms one of a P-gate and an N-gate.

18. The apparatus according to claim 17, wherein the capacitors comprise integrated circuit varactors formed on a Silicon-on-Insulator substrate.

19. A frequency adjustable oscillator, the oscillator including:
 a) at least one inductor;
 b) a plurality of N multiple capacitance level two terminal capacitors coupled together in a parallel configuration, each multiple capacitance level capacitor having a plurality of steady-state capacitance levels, the N capacitors also coupled in parallel with the at least one inductor, wherein the steady-state capacitance level of each multiple capacitance level capacitor is controlled by an associated and corresponding control signal, and wherein the capacitance level measured across the plurality of N multiple capacitance level capacitors has at least $2^N$ distinct capacitance values,
 c) wherein each multiple capacitance level capacitor is operatively coupled to an associated and corresponding one of N control signals, wherein the steady-state capacitance level measured across each multiple capacitance level capacitor varies as a function of the corresponding control signal, and wherein the oscillation frequency of the oscillator varies as a function of the N control signals.

20. The oscillator according to claim 19, wherein the N control signals can be selectably varied between a first and a second predetermined value, and wherein each capacitor has a first steady-state capacitance level when the corresponding control signal is less than or equal to the first predetermined value and has a second steady-state capacitance level when the corresponding control signal is greater than or equal to the second predetermined value.

21. The oscillator according to claim 20, wherein the oscillator further includes a varactor coupled in parallel to the N digital capacitors and the inductor.

22. The apparatus according to claim 20, wherein the difference between the first steady-state capacitance level and the second steady-state capacitance level for each capacitor comprises the differential capacitance of the capacitor and each of the N capacitors has a different differential capacitance.

23. The apparatus according to claim 22, wherein the capacitor having the next lowest differential capacitance includes two capacitors in parallel wherein each of the two capacitors in parallel has the lowest differential capacitance.

24. The apparatus according to claim 21, wherein the ratio of the differential capacitance of the capacitor having the Nth lowest differential capacitance to the differential capacitance of the capacitor having the (N−1)th lowest differential capacitance is approximately equal to a fixed predetermined number for N equal from 1 to (N−1).

25. The apparatus according to claim 21, wherein the ratio of the differential capacitance of the capacitor having the Nth lowest differential capacitance to the differential capacitance of the capacitor having the (N−1)th lowest differential capacitance is approximately equal to two for N equal from 1 to (N−1).

26. The apparatus according to claim 24 wherein the plurality of digital capacitors are formed on an integrated circuit "IC".

27. The apparatus according to claim 26, the IC including:
 a) one of an N-well and P-well implant layer formed in a first semiconductor layer;
 b) a region of one of a N+ and a P+ implant formed in the one of an N-well and P-well implant layer;
 c) an insulating layer formed over a portion of the surface of the one of an N-well and P-well implant layer; and
 d) a second semiconductor layer formed over a portion of the surface of the insulating layer, wherein the insulating layer is positioned between the second semiconductor layer and the region of one of N+ and P+ implants and wherein the second semiconductor layer forms one of a P-gate and an N-gate.

28. The apparatus according to claim 26, wherein the capacitors comprise integrated circuit varactors formed on a Silicon-on-Insulator substrate.

* * * * *